(12) United States Patent
Lee et al.

(10) Patent No.: US 11,538,387 B1
(45) Date of Patent: Dec. 27, 2022

(54) POWER MODULE AND ELECTRONIC DEVICE THEREWITH

(71) Applicant: SAMSUNG ELECTRONICS CO., LTD., Suwon-si (KR)

(72) Inventors: Dongyeol Lee, Seoul (KR); Dongwook Suh, Bucheon-si (KR); Wangsuk Sung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/688,181

(22) Filed: Mar. 7, 2022

(30) Foreign Application Priority Data

Jun. 25, 2021 (KR) .......................... 10-2021-0083110

(51) Int. Cl.
*G09G 3/20* (2006.01)
*H03K 5/24* (2006.01)
*G11C 19/28* (2006.01)

(52) U.S. Cl.
CPC .......... *G09G 3/20* (2013.01); *G09G 2330/021* (2013.01); *G11C 19/28* (2013.01); *H03K 5/24* (2013.01)

(58) Field of Classification Search
CPC .... G09G 3/20; G09G 2330/021; G11C 19/28; H03K 5/24
See application file for complete search history.

(56) References Cited

U.S. PATENT DOCUMENTS

| | | | |
|---|---|---|---|
| 6,278,421 | B1 | 8/2001 | Ishida et al. |
| 9,886,048 | B2 | 2/2018 | Du et al. |
| 10,170,994 | B1 | 1/2019 | Gibney et al. |
| 10,601,320 | B2 | 3/2020 | Balteanu et al. |
| 10,613,563 | B2 | 4/2020 | Yasusaka et al. |
| 10,649,513 | B2 | 5/2020 | Wang |
| 10,871,794 | B2 | 12/2020 | Ogura |
| 2013/0200728 | A1 | 8/2013 | Liu et al. |
| 2019/0197974 | A1* | 6/2019 | Shan ............... G11C 19/28 |
| 2021/0142704 | A1 | 5/2021 | Kim et al. |

FOREIGN PATENT DOCUMENTS

KR 10-2007-0003410 A 1/2007
KR 10-2019-0127420 A 11/2019

* cited by examiner

*Primary Examiner* — Sejoon Ahn
(74) *Attorney, Agent, or Firm* — Volentine, Whitt & Francos, PLLC

(57) ABSTRACT

Disclosed is a power module which includes a first power module that generates a first output current based on a first input voltage, a second power module that generates a second output voltage based on a second input voltage, generates a second output current based on the second output voltage, and generates the second output current when a level of the first input voltage is smaller than a level of a reference voltage, and a voltage controller that generates a feedback signal for regulating at least one of the level of the first input voltage and a level of the second input voltage based on current information about a current flowing in the power module.

20 Claims, 19 Drawing Sheets

POWER MODULE AND ELECTRONIC DEVICE THEREWITH

CROSS-REFERENCE TO RELATED APPLICATIONS

This application claims priority under 35 U.S.C. § 119 to Korean Patent Application No. 10-2021-0083110 filed on Jun. 25, 2021, in the Korean Intellectual Property Office, the disclosure of which is hereby incorporated by reference in its entirety.

BACKGROUND

Embodiments of the present disclosure described herein relate to a power module and an electronic device including the same, and more particularly, relate to a power module regulating a level of a voltage for the purpose of maximizing the efficiency of a power delivered that a system load consumes and an electronic device including the same.

Nowadays, as operations that electronic devices perform are diverse, a range of a load current flowing in electronic devices are also diverse. For example, as the resolution and scan rates of a display device increase, the display device operates at various resolutions and scan rates, and thus, a range of a load current that the display device covers also expands. As such, recently, a power supply device that applies a sufficiently large voltage to an electronic device such that the electronic device operates with a maximum load current has been developed. However, because the situation in which the maximum load current flows in the electronic device is temporary and occurs only under restrictive conditions, a way to always apply a large voltage to the electronic device for such a situation is very wasteful and inefficient.

SUMMARY

Embodiments of the present disclosure provide a power module regulating a level of an input voltage by monitoring the amount of current flowing to the power module such that an electronic device consumes power with maximum efficiency depending on the power that a system load requires, and an electronic device including the same.

According to an embodiment, a power module includes a first power module that generates a first output current based on a first input voltage, a second power module that generates a second output voltage based on a second input voltage, generates a second output current based on the second output voltage, and generates the second output current when a level of the first input voltage is smaller than a level of a reference voltage, and a voltage controller that generates a feedback signal for regulating at least one of the level of the first input voltage and a level of the second input voltage based on current information about a current flowing in the power module.

According to an embodiment, a method of supplying power includes generating a first output current based on a first input voltage, comparing a level of the first input voltage and a level of a reference voltage, generating a comparison signal based on a comparison result of comparing the level of the first input voltage and the level of the reference voltage, generating a result code corresponding to accumulated information of the comparison signal, generating a second output current based on the result code and a second input voltage, providing the power to an external device based on the first output current and the second output current, sensing at least one of the first output current and the second output current to generate current information, generating a feedback signal for regulating a level of at least one of the first input voltage and the second input voltage based on the current information, and regulating and outputting the level of the at least one of the first input voltage and the second input voltage based on the feedback signal.

According to an embodiment, a display device includes a display panel that displays an image, a power management integrated circuit that generates a first input voltage and a second input voltage, and a display driving circuit that generates gate signals on a plurality of gate lines and generates data voltages on a plurality of data lines. The display driving circuit includes a power module that provides power necessary for the display panel based on at least one of the first input voltage and the second input voltage. The power module generates a first current based on the first input voltage, generates a second current based on the first input voltage and a second input voltage when a drop of the first input voltage occurs, and monitors the first current and the second current to generate a feedback signal for regulating a level of at least one of the first input voltage and the second input voltage based on at least one of the first current and the second current.

BRIEF DESCRIPTION OF THE DRAWINGS

The above and other objects and features of the present disclosure will become apparent by the detailed description of the embodiments thereof with reference to the accompanying drawings.

DETAILED DESCRIPTION

Below, embodiments of the present disclosure will be described in such detail and clarity to an extent that one skilled in the art easily understands the present disclosure.

Figure 1:
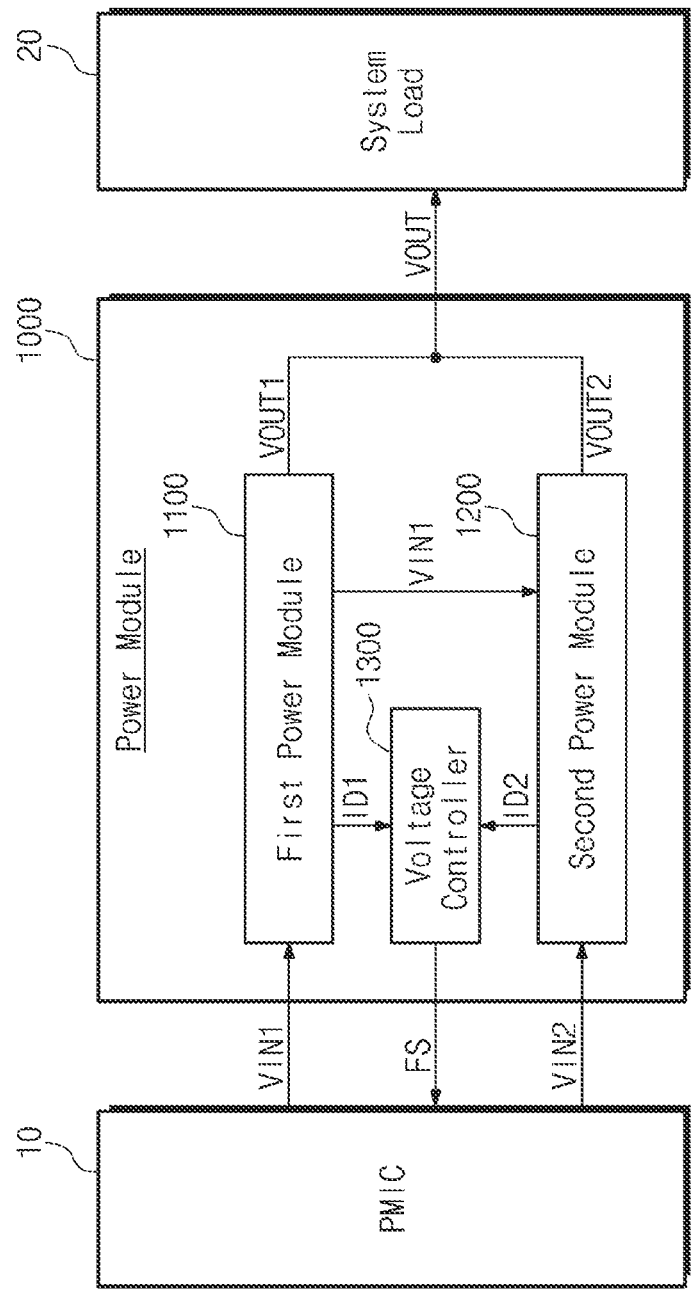
FIG. 1 is a configuration diagram illustrating a power module and an electronic device including the power module, according to an embodiment of the present disclosure.

FIG. 1 is a configuration diagram illustrating an electronic device, according to an embodiment of the present disclosure. An electronic device according to an embodiment of the present disclosure may include a power management integrated circuit (PMIC) 10, a power module 1000, and a system load 20. The electronic device according to an embodiment of the present disclosure may include various electronic devices, which are capable of being supplied with a power, such as a smartphone, a smart pad, a wearable device, a digital camera, a television device, a display monitor, a laptop computer, a black-box, and a robot.

The power management integrated circuit 10 may provide various levels of voltages based on a battery placed inside or outside the electronic device. The power management integrated circuit 10 according to an embodiment of the present disclosure may provide a first input voltage VIN1 and a second input voltage VIN2. For example, the first input voltage VIN1 and the second input voltage VIN2 may be provided as separate voltage sources. The power management integrated circuit 10 may regulate a level of the first input voltage VIN1 based on a feedback signal FS. Accordingly, the level of the first input voltage VIN1 may increase or decrease by the feedback signal FS. However, the power management integrated circuit 10 is not limited thereto, and may also regulate a level of the second input voltage VIN2.

The power module 1000 may include a first power module 1100, a second power module 1200, and a voltage controller 1300. The power module 1000 may generate an output voltage VOUT based on the first input voltage VIN1 and the second input voltage VIN2. In the case of providing a sufficient power to the system load 20 only with the first input voltage VIN1, the power module 1000 may generate the output voltage VOUT by using the first input voltage VIN1 only. In contrast, in the case of failing to provide a sufficient power to the system load 20 only with the first input voltage VIN1 as a level of a load current consumed by the system load 20 increases, the power module 1000 may generate the output voltage VOUT by using the second input voltage VIN2 together with the first input voltage VIN1.

In addition, the power module 1000 may monitor a load current flowing to the system load 20. Herein, the load current may be variable. For example, the power module 1000 may measure a level of a current, which is based on the first input voltage VIN1, and a level of a current, which is based on the second input voltage VIN2. The power module 1000 according to an embodiment of the present disclosure may generate the feedback signal FS based on the measured current level. Here, the feedback signal FS may include information indicating whether to increase, decrease, or maintain the level of the first input voltage VIN1.

The first power module 1100 may generate a first output voltage VOUT1 based on the first input voltage VIN1. For example, to supply a power stably, the first power module 1100 may step up, step down, and/or invert the first input voltage VIN1. For example, the first power module 1100 may remove a noise of the first input voltage VIN1. In addition, the first power module 1100 may provide the first input voltage VIN1 to the second power module 1200. Although not illustrated in FIG. 1, the first power module 1100 may provide the first output voltage VOUT1 to the second power module 1200.

The first power module 1100 according to an embodiment of the present disclosure may generate first current information ID1. Here, the first current information ID1 may include information about a current (hereinafter referred to as a "first current") that is based on the first input voltage VIN1 and/or the first output voltage VOUT1. For example, the first current information ID1 may include a level of the first current and/or a set of values obtained by sampling the first current at a regular interval (or period). A configuration and an operation of the first power module 1100 will be described in detail with reference to FIGS. 2A and 2B.

The second power module 1200 may generate a second output voltage VOUT2 based on the first input voltage VIN1 and the second input voltage VIN2. For example, when the system load 20 requires a power of a given level or higher, a voltage drop may occur at the first output voltage VOUT1. In this case, to compensate for the voltage drop of the first output voltage VOUT1, the second power module 1200 may generate the second output voltage VOUT2. For example, the second power module 1200 may determine a level of an additional current based on the first input voltage VIN1 and may generate the second output voltage VOUT2 corresponding to the level of the additional current based on the second input voltage VIN2. Although not illustrated in FIG. 1, the second power module 1200 may generate the second output voltage VOUT2 based on the first output voltage VOUT1 and the second input voltage VIN2. In this case, the second power module 1200 may determine the level of the additional current based on the first output voltage VOUT1.

The second power module 1200 according to an embodiment of the present disclosure may generate second current information ID2. Here, the second current information ID2 may include information about a current (hereinafter referred to as a "second current") that is based on the second input voltage VIN2 and/or the second output voltage VOUT2. For example, the second current information ID2 may include a level of the second current and/or a set of values obtained by sampling the second current at a regular interval (or period). A configuration and an operation of the second power module 1200 will be described in detail with reference to FIGS. 2A and 2B.

The voltage controller 1300 may be configured to monitor the first current and/or the second current. The voltage controller 1300 according to an embodiment of the present disclosure may receive the first current information ID1 and/or the second current information ID2 from the first power module 1100 and/or the second power module 1200. According to an embodiment of the present disclosure, a time period in which the first current information ID1 and the second current information ID2 are received and a cycle at which the first current information ID1 and the second current information ID2 are received may be determined depending on a request of a user or settings of a manufacturer. Also, the time period in which the first current information ID1 and the second current information ID2 are received and the cycle at which the first current information ID1 and the second current information ID2 are received may not be fixed and may be determined so as to be adjusted in real time. For example, when the first current information ID1 and the second current information ID2 include an analog current signal only, the voltage controller 1300 may sample the first current and the second current at a regular interval (or periodically).

In addition, the voltage controller 1300 may generate the feedback signal FS based on at least one of the first current information ID1 and the second current information ID2. For example, the voltage controller 1300 may calculate the level of the first input voltage VIN1 based on at least one of the first current information ID1 and the second current information ID2, so as to correspond to a power that the system load 20 requires. Here, the level of the first input voltage VIN1 according to an embodiment of the present disclosure will be described with reference to Equation 1 to Equation 4 below.

$$IL = I1 + I2 \qquad \text{[Equation 1]}$$

$$P = I1 * VIN1 + I2 * VIN2 \qquad \text{[Equation 2]}$$

$$VIN1 \leq VIN2 \qquad \text{[Equation 3]}$$

$$Pmin = IL * VIN1 \qquad \text{[Equation 4]}$$

Referring to Equation 1 to Equation 4, "IL" is defined as a level of a total of current flowing to the system load 20. "I1" is defined as a level of a current that the first power module 1100 supplies to the system load 20, and "I2" is defined as a level of a current that the second power module 1200 supplies to the system load 20. "P" is defined as the total amount of power that the system load 20 consumes. "Pmin" is defined as a minimum value of the total amount of power that the system load 20 consumes.

Referring to Equation 1 and Equation 2, the total amount of current flowing to the system load 20 is determined by a sum of I1 and I2, and the total amount of power that the system load 20 consumes is determined by a product of I1 and the first input voltage VIN1 and a product of I2 and the second input voltage VIN2. According to an embodiment of the present disclosure, in Equation 3, it is assumed that the level of the first input voltage VIN1 is smaller than or equal to the level of the second input voltage VIN2. However, the present disclosure is not limited thereto. For example, the level of the first input voltage VIN1 may be greater than the level of the second input voltage VIN2. For convenience, the description will be given under the assumption of validity of Equation 3. When the level of the first input voltage VIN1 is always smaller than or equal to the level of the second input voltage VIN2, the minimum value Pmin of the total amount of power that the system load 20 consumes may be determined based on Equation 4.

Accordingly, according to an embodiment of the present disclosure complying with the assumption of validity of Equation 3, Pmin may be minimized by adjusting (or regulating) the level of the first input voltage VIN1. In an embodiment, the voltage controller 1300 may calculate the level of the first input voltage VIN1 based on the second current information ID2. In this case, the voltage controller 1300 may periodically calculate the increment or decrement of the level of the second current. For example, when the increment of the level of the second current exceeds a first threshold value, the voltage controller 1300 may generate the feedback signal FS for increasing the level of the first input voltage VIN1 that the power management integrated circuit 10 will output. For example, when the decrement of the level of the second current exceeds a second threshold value, the voltage controller 1300 may generate the feedback signal FS for decreasing the level of the first input voltage VIN1 that the power management integrated circuit 10 will output. For example, when the increment of the level of the second current is smaller than or equal to the first threshold value and the decrement of the level of the second current is smaller than or equal to the second threshold value, the voltage controller 1300 may generate the feedback signal FS for maintaining the level of the first input voltage VIN1, which the power management integrated circuit 10 will output, so as to be identical to a current level. According to an embodiment of the present disclosure, a period at which the level of the first input voltage VIN1 is adjusted may be changed by a request of the user or settings of a manufacturer.

The voltage controller 1300 may generate the feedback signal FS including information about the level of the first input voltage VIN1. The power management integrated circuit 10 may be provided with the feedback signal FS. The power management integrated circuit 10 may increase, decrease, or maintain the level of the first input voltage VIN1 so as to correspond to a level of the first input voltage VIN1 that the feedback signal FS indicates, and may output the first input voltage VIN1 to the first power module 1100. Unlike the example illustrated in FIG. 1, the voltage controller 1300 according to an embodiment of the present disclosure may be located in the system load 20.

The system load 20 may operate based on the output voltage VOUT, that is, may consume a power. The system load 20 may be variously implemented with chips or modules included in the electronic device, for example, a communication circuit, a memory, an application processor, storage, a display driver integrated circuit (DDI), and an input/output (I/O) interface. However, the present disclosure is not limited thereto. For example, the system load 20 may include any system or sub-device that requires power. An example is illustrated in FIG. 1 as the system load 20 is supplied only with the output voltage VOUT, but the present disclosure is not limited thereto. For example, the system load 20 may be supplied with any other voltage from any other voltage source, as well as the output voltage VOUT.

Figure 2A:
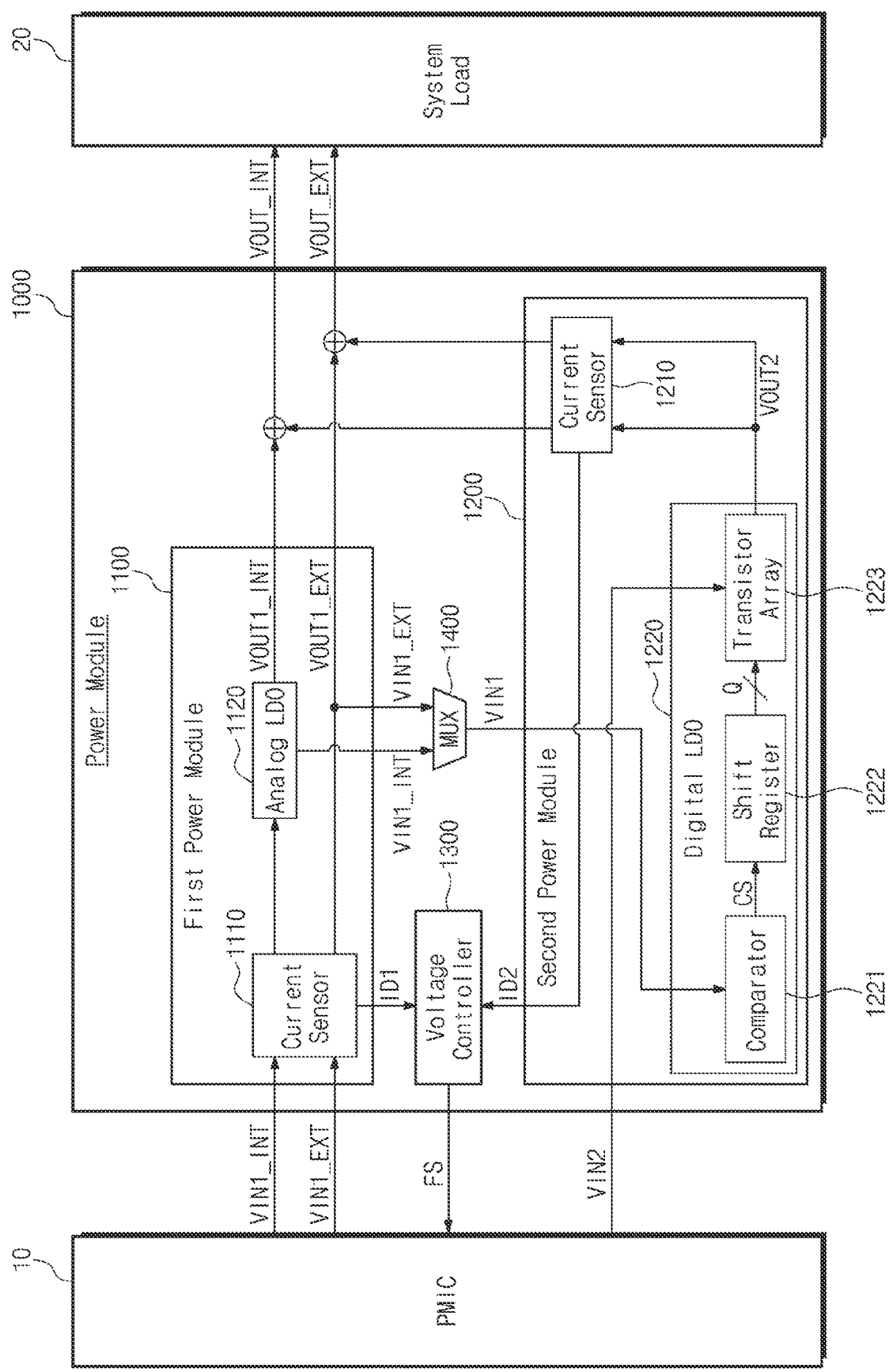
FIGS. 2A and 2B are configuration diagrams illustrating a power module in detail, according to an embodiment of the present disclosure.
Figure 2B:
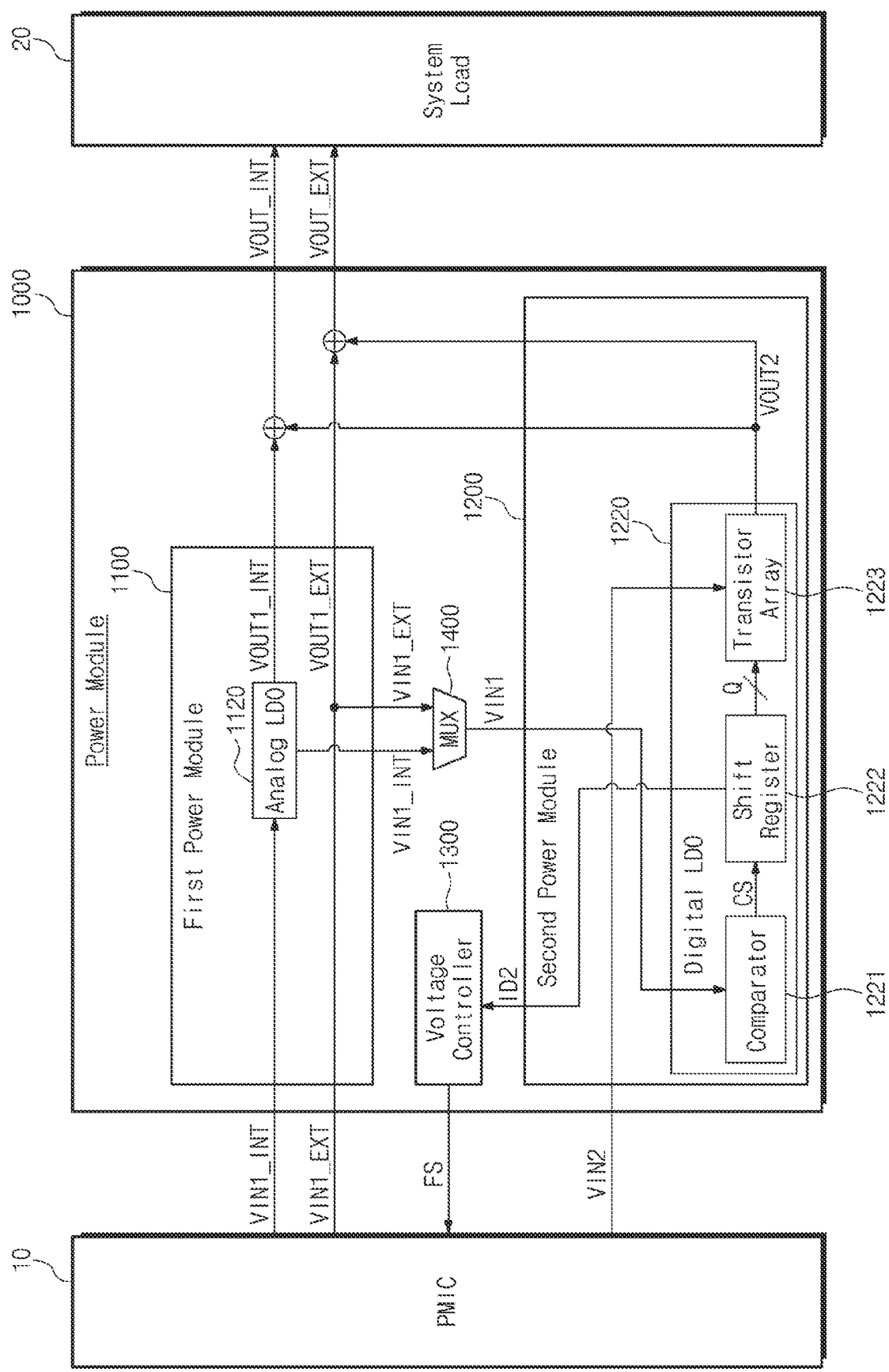

FIGS. 2A and 2B are configuration diagrams illustrating a power module in detail, according to an embodiment of the present disclosure. For convenience, the description given with reference to FIG. 1 will be omitted to avoid redundancy.

Referring to FIG. 2A, the first power module 1100 may include at least one current sensor 1110 and an analog low dropout (LDO) regulator 1120. Although not illustrated in FIG. 2A, the first power module 1100 according to an embodiment of the present disclosure may further include an amplifier for signal amplification or an attenuator for signal attenuation. Although not illustrated in FIG. 2A, each of the first power modules 1100 and the second power module 1200 may further include a switching regulator for regulating an input voltage.

Meanwhile, the first power module 1100 may generate a voltage in at least two modes including an internal power supply mode and an external power supply mode, depending on a request of the user or settings of a manufacturer. A power supply manner may be selected depending on a range of a power that the system load 20 consumes. For example, according to the internal power supply mode, a first input voltage of the internal power supply manner (hereinafter referred to as a "first internal input voltage") VIN1_INT may be received from the power management integrated circuit 10, and a first output voltage of the internal power supply mode (hereinafter referred to as a "first internal output voltage") VOUT1_INT having a specific level may be generated through the analog LDO regulator 1120. For example, according to the external power supply mode, a first input voltage of the external power supply mode (hereinafter referred to as a "first external input voltage") YIN1_EXT may be received from the power management integrated circuit 10, and a first output voltage of the external power supply mode (hereinafter referred to as a "first external output voltage") VOUT1_INT may be output through a line. Meanwhile, a level of the first external input voltage YIN1_EXT may decrease due to a parasitic resistance. Accordingly, a level of the first external output voltage VOUT1_EXT may be smaller than the level of the first external input voltage YIN1_EXT.

The current sensor 1110 may generate the first current information ID1 based on the first internal input voltage YIN1_INT or the first external input voltage YIN1_EXT. Simultaneously or alternatively, although not illustrated in FIG. 2A, the current sensor 1110 may generate the first current information ID1 based on the first internal output voltage VOUT1_INT or the first external output voltage VOUT1_EXT. For example, the current sensor 1110 may sense (or detect) a current that is generated by a voltage output from the power management integrated circuit 10. The current sensor 1110 may sample a level of the sensed current periodically. How the current sensor 1110 samples a current will be described with reference to FIG. 11. The current sensor 1110 may generate the first current information ID1 including periodically sampled current values.

The analog LDO regulator 1120 may generate the first internal output voltage VOUT1_INT based on the first internal input voltage YIN1_INT. For example, the analog LDO regulator 1120 may regulate the first internal input voltage VIN1_INT so as to have a given level. The analog LDO regulator 1120 may generate the first internal output voltage VOUT1_INT being a result of regulating the level of the first internal input voltage VIN1_INT. A configuration and an operation of the analog LDO regulator 1120 will be described in detail with reference to FIG. 3.

The second power module 1200 may include at least one current sensor 1210 and a digital low dropout (LDO) regulator 1220. The current sensor 1210 may generate the second current information ID2 based on the second output voltage VOUT2. Simultaneously or alternatively, although not illustrated in FIG. 2A, the current sensor 1210 may generate the second current information ID2 based on the second input voltage VIN2. An operation in which the current sensor 1210 generates the second current information ID2 is similar to the operation in which the current sensor 1110 generates the first current information ID1, and thus, additional description will be omitted to avoid redundancy.

The digital LDO regulator 1220 may include a comparator 1221, a shift register 1222, and a transistor array 1223.

The comparator 1221 may generate a comparison signal CS based on the first input voltage VIN1. Here, the first input voltage VIN1 may be the first internal input voltage VIN1_INT or the first external input voltage VIN1_EXT depending on a power supply mode of the first power module 1100. For example, when the first power module 1100 operates in the internal power supply mode, the first input voltage VIN1 may be the first internal input voltage YIN1_INT. For example, when the first power module 1100 operates in the external power supply mode, the first input voltage VIN1 may be the first external input voltage VIN1_EXT. In addition, the comparator 1221 may compare the first input voltage VIN1 and a reference voltage. For example, the comparator 1221 may generate the comparison signal CS that is based on a result of comparing the reference voltage and the first input voltage VIN1. Here, the reference voltage is a voltage that is used to determine whether there is required an additional power supply through the second power module 1200. A configuration and an operation of the comparator 1221 will be described in detail with reference to FIG. 4.

The shift register 1222 may generate a result code "Q" based on the comparison signal CS. Here, the result code "Q" may be a binary code corresponding to a level of a current that the second power module 1200 outputs. For example, in the case where the shift register 1222 is a 5-bit shift register, the shift register 1222 may generate a 5-bit result code "Q" (e.g., "00000"). The shift register 1222 according to an embodiment of the present disclosure may be controlled by a separate controller (not illustrated) located inside or outside the second power module 1200. The shift register 1222 according to an embodiment of the present disclosure may receive a signal for resetting the result code "Q", although not illustrated in FIG. 2A. A configuration and an operation of the shift register 1222 will be described in detail with reference to FIGS. 4 and 5.

The transistor array 1223 may generate the second output voltage VOUT2 based on the result code "Q" and the second input voltage VIN2. The transistor array 1223 may include a plurality of transistors. For example, the transistor array 1223 may regulate a level of a current by turning on or turning off transistors. Here, whether to turn on or turn off transistors may be determined by the result code "Q". A configuration and an operation of the transistor array 1223 will be described in detail with reference to FIG. 4.

The voltage controller 1300 may generate the feedback signal FS based on at least one of the first current information ID1 and the second current information ID2. For example, the voltage controller 1300 may determine the variations in a level of a current flowing in the first power module 1100 from the first current information ID1 or may determine the variations in a level of a current flowing in the second power module 1200 from the second current information ID2. The voltage controller 1300 may generate the feedback signal FS for regulating a level of at least one of the first internal input voltage YIN1_INT, the first external input voltage VIN1_EXT, and the second input voltage VIN2, which the power management integrated circuit 10 will output, based on the variations in the current level thus determined.

FIG. 2B is a configuration diagram illustrating a current sensing mode of a power module, according to an embodiment of the present disclosure. For convenience, the description given with reference to FIG. 2A will be omitted to avoid redundancy.

According to an embodiment of the present disclosure, each of the first power module 1100 and the second power module 1200 may omit a separate current sensor for sensing a current. In an embodiment, the shift register 1222 may generate the second current information ID2. Here, the second current information ID2 may correspond to the result code "Q". That is, because the result code "Q" corresponds to a level of a current that the second power module 1200 outputs, the second current information ID2 may correspond to information about the level of the current that the second power module 1200 outputs.

The voltage controller 1300 may generate the feedback signal FS based the second current information ID2. The voltage controller 1300 may receive the second current information ID2 corresponding to the result code "Q" from the shift register 1222. Here, a cycle at which the voltage controller 1300 receives the second current information ID2 may change depending on a request of the user or settings of a manufacturer. The voltage controller 1300 may calculate an increment or decrement of a level of a current, which the second power module 1200 outputs, from the result code "Q".

Figure 3A:
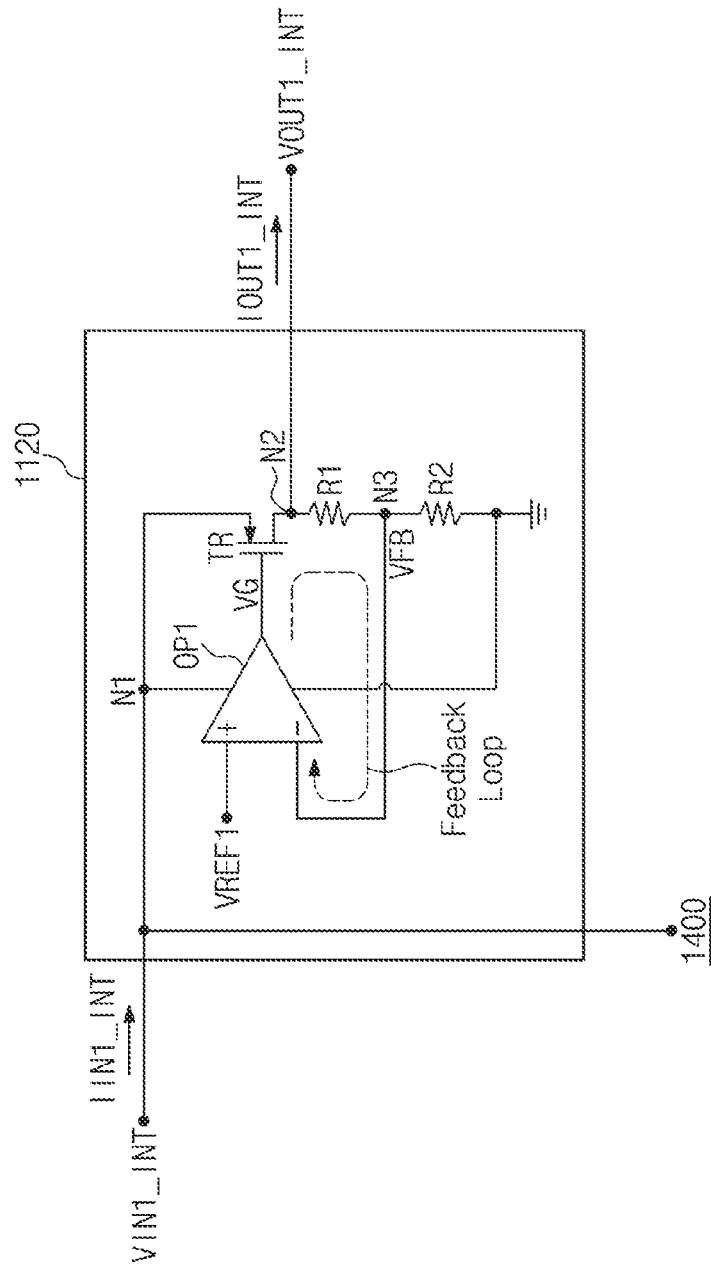
FIGS. 3A and 3B are configuration diagrams illustrating the analog LDO regulator 1120 illustrated in FIGS. 2A and 2B in detail.
Figure 3B:
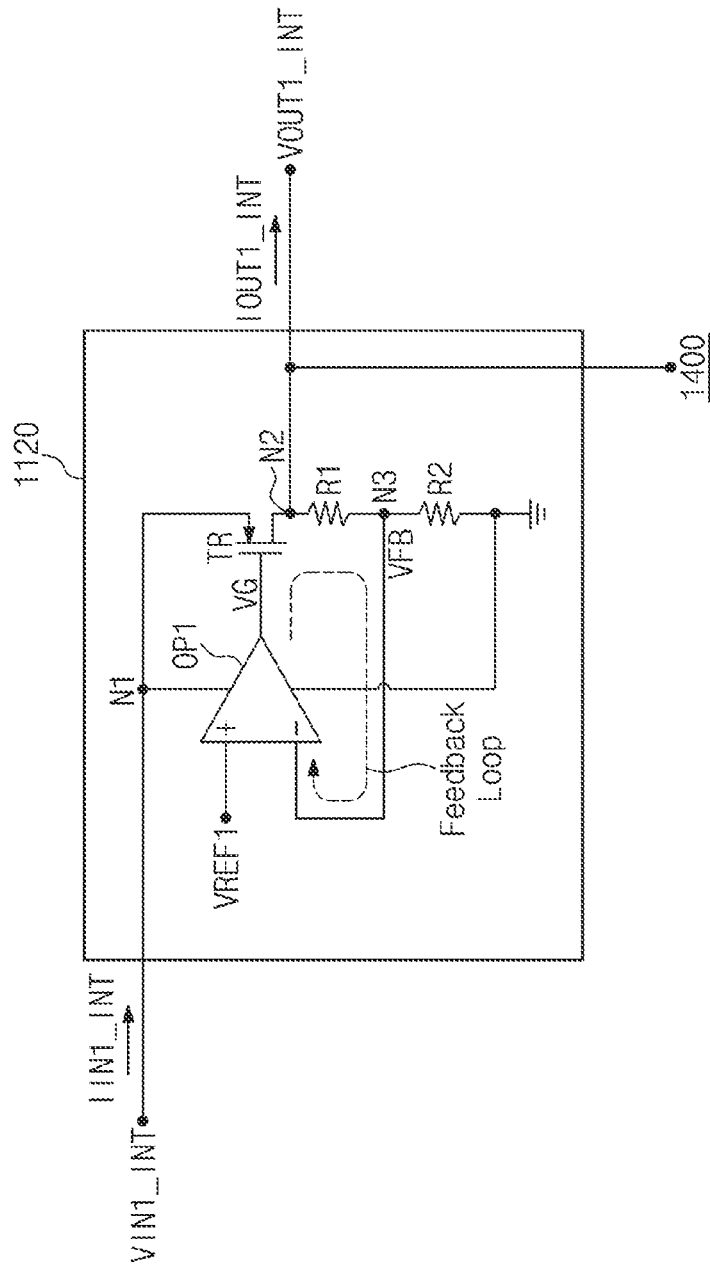

FIGS. 3A and 3B are configuration diagrams illustrating the analog LDO regulator 1120 illustrated in FIGS. 2A and 2B in detail. Referring to FIG. 3A, the analog LDO regulator 1120 may include a first error operational amplifier (OP-AMP) OP1, a pass transistor TR, a first resistor R1, and a second resistor R2. The analog LDO regulator 1120 may generate the first internal output voltage VOUT1_INT based on the first internal input voltage YIN1_INT.

The first error OP-AMP OP1 may include a (+) input terminal, a (−) input terminal, a positive power terminal, a negative power terminal, and an output terminal. A first reference voltage VREF1 may be applied to the (+) input terminal of the first error OP-AMP OP1, and a feedback voltage VFB may be applied to the (−) input terminal thereof. The first internal input voltage YIN1_INT may be applied to the positive power terminal of the first error OP-AMP OP1, and a ground node may be connected with the negative power terminal thereof. According to an embodiment of the present disclosure, although not illustrated in FIG. 3A, a charge pump (not illustrated) may be further provided between a first node N1 and the positive power terminal. According to an embodiment of the present disclosure, unlike the example illustrated in FIG. 3A, a separate bias voltage may be applied to the positive power terminal.

In addition, the first error OP-AMP OP1 may compare the first reference voltage VREF1 and the feedback voltage VFB. The first error OP-AMP OP1 may amplify a difference between the first reference voltage VREF1 and the feedback voltage VFB to output a gate voltage VG through the output terminal thereof.

The pass transistor TR may include a first end (e.g., a source) to which the first internal input voltage YIN1_INT is input, a second end (e.g., a drain) from which the first internal output voltage VOUT1_INT is output, and a third end (e.g., a gate) connected with the output terminal of the first error OP-AMP OP1. For example, the pass transistor TR may be a p-channel metal-oxide-semiconductor (PMOS) transistor, but the present disclosure is not limited thereto. For example, the pass transistor TR may be implemented with any transistor capable of performing a switching operation and/or an amplification operation. The pass transistor TR may be driven based on the gate voltage VG input to the third end thereof.

The first resistor R1 may be connected between a second node N2 and a third node N3, and the second resistor R2 may be connected between the third node N3 and the ground node. The first resistor R1 and the second resistor R2 may divide a voltage (e.g., the first internal output voltage VOUT1_INT) of the second node N2 connected with the second end of the pass transistor TR such that the feedback voltage VFB is transferred to the (−) input terminal of the first error OP-AMP OP1. A value of the first resistor R1 and a value of the second resistor R2 may be variable depending on a request of the user or settings of a manufacturer. However, the present disclosure is not limited thereto. For example, each of the first resistor R1 and the second resistor R2 may have a fixed value. As a result, a feedback loop in which the first error OP-AMP OP1 receives the feedback voltage VFB to output the gate voltage VG to the output terminal thereof and the first internal output voltage VOUT1_INT of the second end of the pass transistor TR is divided may be implemented. In addition, the analog LDO regulator 1120 may transfer the first internal output voltage VOUT1_INT to a multiplexer 1400 (refer to FIG. 2B).

However, the present disclosure is not limited thereto. The analog LDO regulator 1120 may transfer a voltage of a line, which is present therein, to the multiplexer 1400. For example, as illustrated in FIG. 3B, the analog LDO regulator 1120 may transfer the first internal output voltage VOUT1_INT to the multiplexer 1400. Below, for convenience, the description is given under the assumption that the analog LDO regulator 1120 transfers the first internal output voltage VOUT1_INT to the multiplexer 1400, as illustrated in FIG. 3A. However, the present disclosure is not limited thereto.

Figure 4:
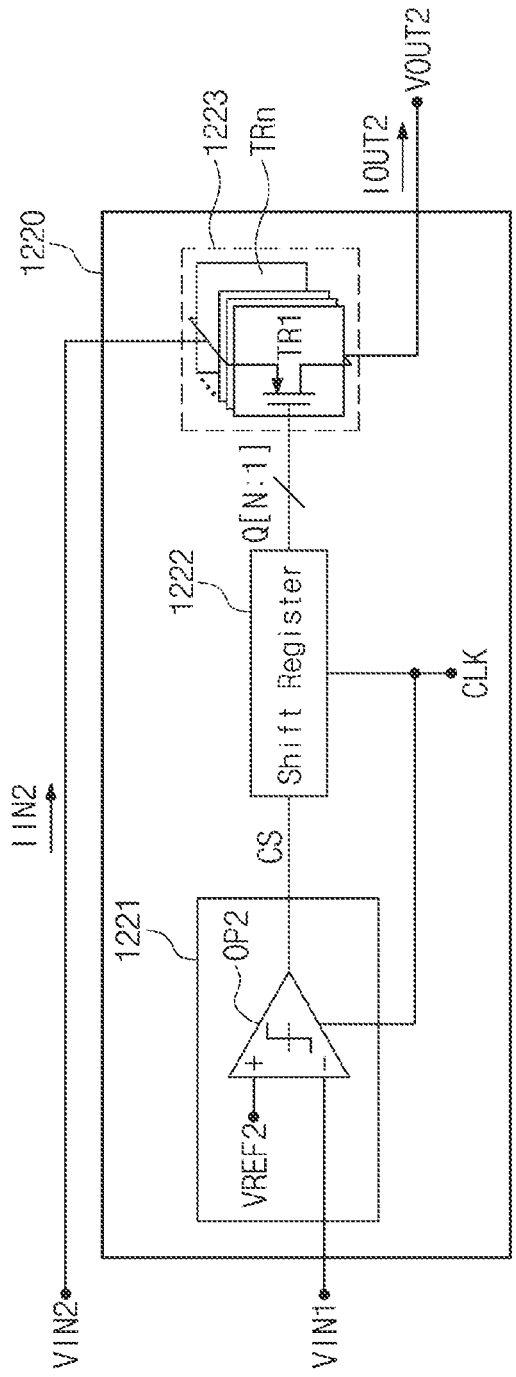
FIG. 4 is a configuration diagram illustrating the digital LDO regulator 1220 illustrated in FIGS. 2A and 2B in detail.

FIG. 4 is a configuration diagram illustrating the digital LDO regulator 1220 illustrated in FIGS. 2A and 2B in detail. For convenience, the description given with reference to FIGS. 2A and 2B will be omitted to avoid redundancy.

The comparator 1221 may include a second error OP-AMP OP2. For example, the second error OP-AMP OP2 may operate as an analog-to-digital converter (ADC). The second error OP-AMP OP2 may operate in synchronization with a clock signal CLK. The second error OP-AMP OP2 may include a (+) input terminal, a (−) input terminal, and an output terminal. A second reference voltage VREF2 may be applied to the (+) input terminal of the second error OP-AMP OP2, and the first input voltage VIN1 may be applied to the (−) input terminal thereof. The second error OP-AMP OP2 may output the comparison signal CS through the output terminal thereof.

The second error OP-AMP OP2 may compare a level of the second reference voltage VREF2 and a level of the first input voltage VIN1. For example, when the level of the second reference voltage VREF2 is higher than the level of the first input voltage VIN1, the second error OP-AMP OP2 may generate the comparison signal CS of a value (e.g., "1") indicating logic high. In contrast, when the level of the second reference voltage VREF2 is lower than the level of the first input voltage VIN1, the second error OP-AMP OP2 may generate the comparison signal CS of a value (e.g., "0") indicating logic low.

The shift register 1222 may generate an N-bit result code Q[N:1] based on the comparison signal CS. Here, "N" is a natural number of 1 or more. For example, in the case where the shift register 1222 is a 5-bit shift register, the shift register 1222 may generate a 5-bit result code Q[5:1]. The shift register 1222 may operate in synchronization with the clock signal CLK. The shift register 1222 may check the comparison signal CS periodically and may generate the result code Q[N:1] whose value increases when the comparison signal CS is "1" and decreases when the comparison signal CS is "0". For example, when the N-bit result code Q[N:1] is a 5-bit result code Q[5:1], the 5-bit result code Q[5:1] may be "00000, 00001, 00010, 00011, . . . , 11111". An operation in which the shift register 1222 generates the N-bit result code Q[N:1] will be described in detail with reference to FIG. 5.

Although not illustrated in FIG. 4, in an embodiment, the shift register 1222 may generate the second current information ID2. Here, the second current information ID2 may correspond to the N-bit result code Q[N:1].

The transistor array 1223 may output a second output current IOUT2. The transistor array 1223 may include "n" transistors. Here, "n" is any natural number. In an embodiment, "n" may be greater than or equal to "N". Each of the "n" transistors may include a first end (e.g., a source) to which the second input voltage VIN2 is input, a second end (e.g., a drain) from which the second output voltage VOUT2 is output, and a third end (e.g., a gate) connected with the shift register 1222. For example, each of the "n" transistors may be a p-channel metal-oxide-semiconductor (PMOS) transistor, but the present disclosure is not limited thereto. For example, each of the "n" transistors may be implemented with any transistor capable of performing a switching operation and/or an amplification operation.

The "n" transistors, for example, first to n-th transistors TR1 to TRn may be respectively turned on or turned off based on the N-bit result code Q[N:1]. Accordingly, a level of the second output current IOUT2 may vary depending on a turn-on/turn-off combination of the first to n-th transistors TR1 to TRn of the transistor array 1223. For example, when the N-bit result code Q[N:1] is a 5-bit result code Q[5:1], the first to fifth transistor TR1 to TR5 may be controlled by the 5-bit result code Q[5:1]. In the case where the sixth to n-th transistors TR6 to TRn are present in the transistor array 1223, the sixth to n-th transistors TR6 to TRn may maintain a turn-off state. An example is illustrated in FIG. 4 as the transistor array 1223 includes PMOS transistors. In this case, when a value of a bit is "0", a transistor may be turned on; when a value of a bit is "1", a transistor may be turned off. However, the present disclosure is not limited thereto. For example, a correspondence relationship between a bit value and a turn-on or turn-off of a transistor may be changed through an inverter (not illustrated).

For example, when the 5-bit result code Q[5:1] is "11000", bits constituting the 5-bit result code Q[5:1] may correspond to the first to fifth transistors TR1 to TR5, respectively. The bits that respectively correspond to the first to fifth transistors TR1 to TR5 may be input to the third ends of the first to fifth transistors TR1 to TR5, respectively.

Figure 5:
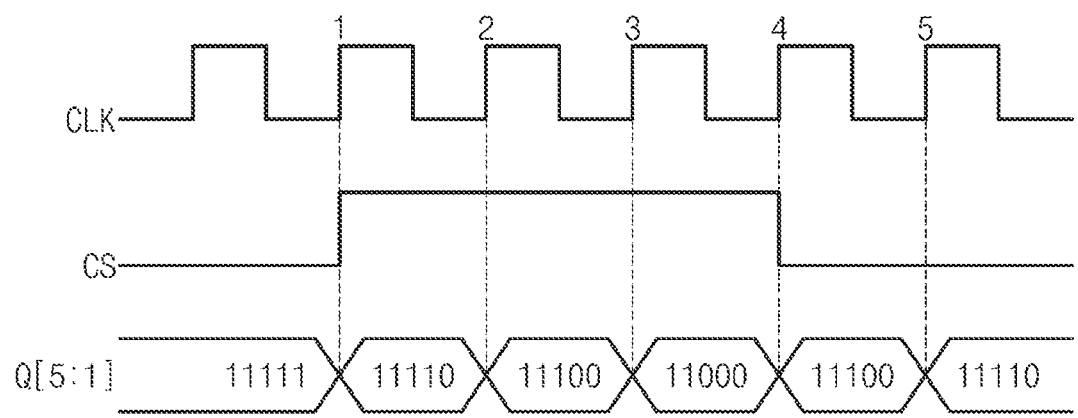
FIG. 5 is a timing diagram for describing an operation of a digital LDO regulator, according to an embodiment of the present disclosure.

FIG. 5 is a timing diagram for describing an operation of a digital LDO regulator, according to an embodiment of the present disclosure. Referring to FIGS. 4 and 5 together, the comparator 1221 and the shift register 1222 may operate in synchronization with the clock signal CLK. The comparator 1221 may generate the comparison signal CS in synchronization with the clock signal CLK. The shift register 1222 may receive the comparison signal CS from the comparator 1221. The shift register 1222 may generate the N-bit result code Q[N:1] based on the clock signal CLK and the comparison signal CS. The description will be given with reference to FIG. 5 under the assumption that the N-bit result code Q[N:1] is a 5-bit result code Q[5:1].

The shift register 1222 may check a value of the comparison signal CS based on the clock signal CLK, every period set according to a request of the user or settings of a manufacturer. The shift register 1222 may generate the 5-bit result code Q[5:1] by changing a code value depending on the value of the comparison signal CS thus checked. For example, a default value of the 5-bit result code Q[5:1] may be set to "11111", but the present disclosure is not limited thereto. Accordingly, when the 5-bit result code Q[5:1] has the default value of "11111", all the transistors (e.g., TR1 to TRn) of the transistor array 1223 are turned off, and a level of the second output current IOUT2 is "0".

The shift register 1222 may shift bits of the 5-bit result code Q[5:1] right or left one by one in synchronization with the clock signal CLK. For example, in the case where the comparison signal CS is "1", the shift register 1222 performs a 1-bit left shift operation. Also, Q[5] is "0". For example, assumed that the shift register 1222 outputs the 5-bit result code Q[5:1] of "11111" at period "t", the shift register 1222 may output "11110" as the 5-bit result code Q[5:1] at period "t+1". When the comparison signal CS is again set to "1", the shift register 1222 may output "11100" as the 5-bit result code Q[5:1] at period (t+2).

In contrast, in the case where the comparison signal CS is "0", the shift register 1222 performs a 1-bit right shift operation. For example, assumed that the shift register 1222 outputs the 5-bit result code Q[5:1] of "11000" at period "t", the shift register 1222 may output "11100" as the 5-bit result code Q[5:1] at period "t+1". When the comparison signal CS is again set to "0", the shift register 1222 may output "11110" as the 5-bit result code Q[5:1] at period (t+2).

Figure 6A:
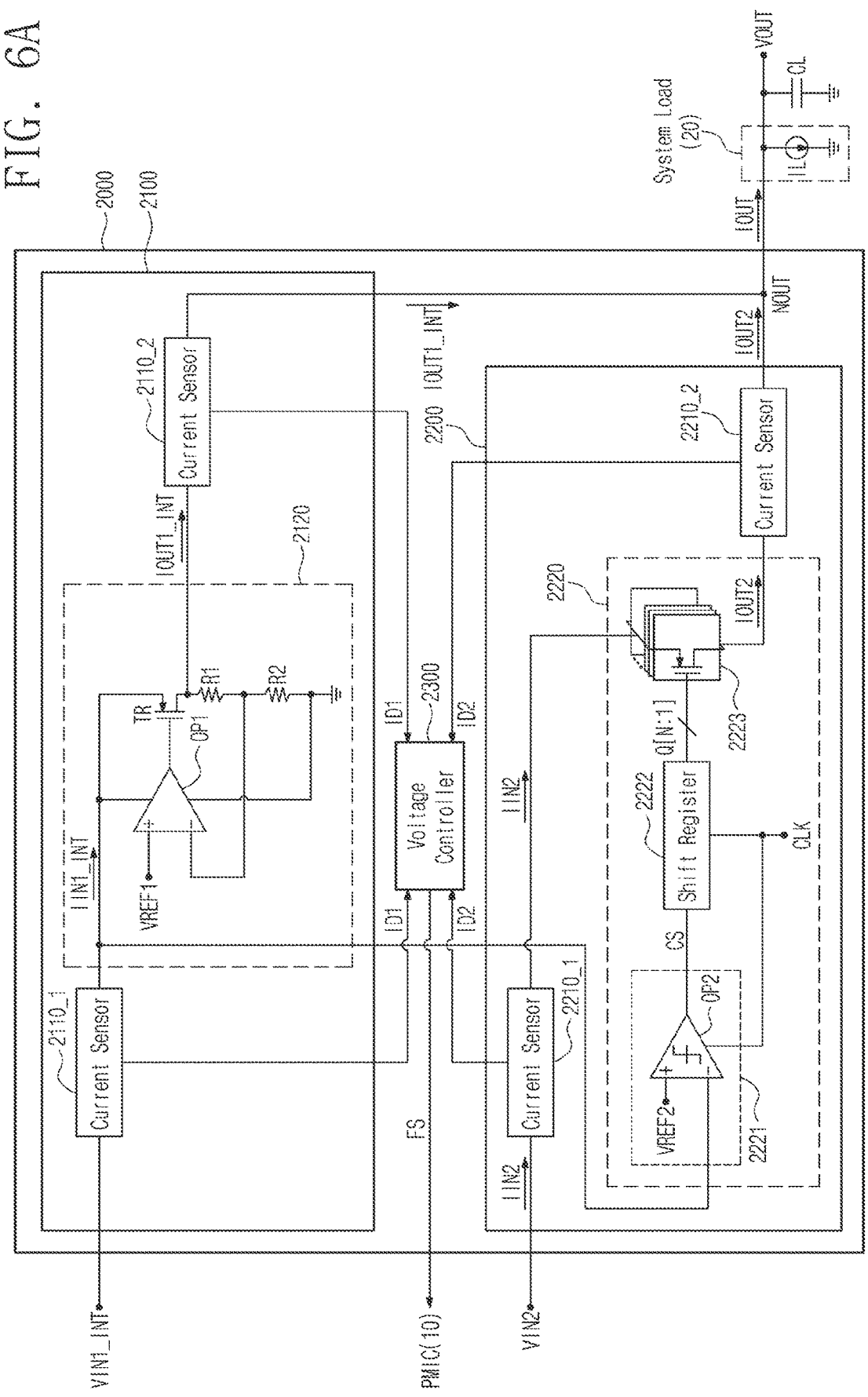
FIGS. 6A and 6B are configuration diagrams illustrating a power module operating in an internal power supply manner, according to an embodiment of the present disclosure.
Figure 6B:
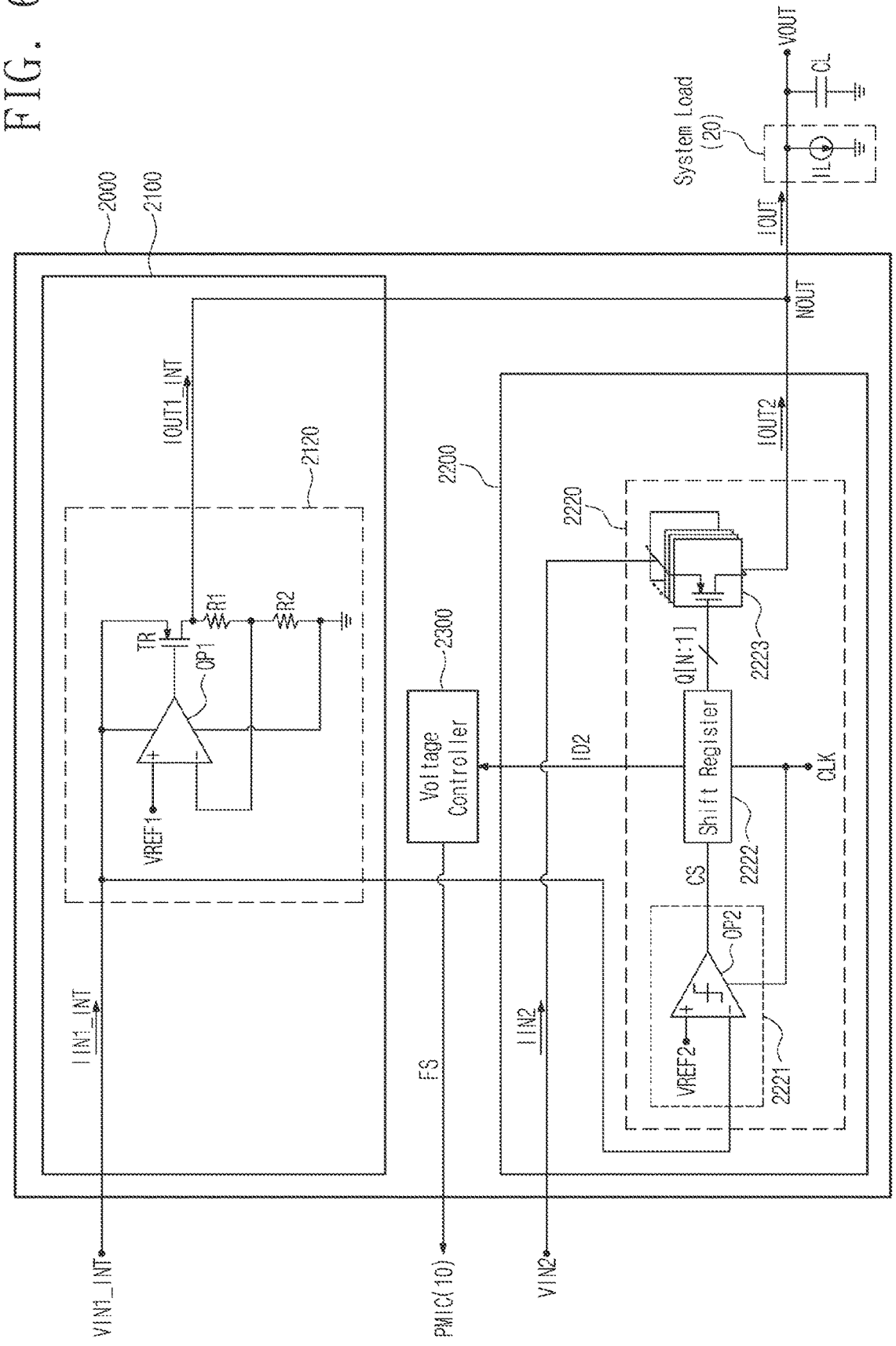

FIGS. 6A and 6B are configuration diagrams illustrating a power module operating in an internal power supply mode, according to an embodiment of the present disclosure. According to an embodiment of the present disclosure, a first input voltage may be used in at least one of the internal power supply mode and the external power supply mode. Referring to FIGS. 6A and 6B, a power module 2000 may generate the output voltage VOUT in the internal power supply mode. For convenience, the description given with reference to FIGS. 1 to 4 will be omitted to avoid redundancy.

FIG. 6A illustrates an embodiment in which the power module 2000 includes a separate current sensor in the internal power supply mode. Referring to FIG. 6A, a first power module 2100 may include a plurality of current sensors 2110_1 and 2110_2, and a second power module 2200 may include a plurality of current sensors 2210_1 and 2210_2. In addition to the plurality of current sensors 2110_1, 2110_2, 2210_1, and 2210_2, although not illustrated in FIG. 6A, a current sensor may be provided on an internal or external line of the power module 2000.

Each of the plurality of current sensors 2110_1, 2110_2, 2210_1, and 2210_2 may sense a current flowing through a line. In detail, the current sensor 2110_1 may sense a first internal input current IIN1_INT. The current sensor 2110_2 may sense a first internal output current IOUT1_INT. The current sensor 2210_1 may sense a second input current IIN2. The current sensor 2210_2 may sense a second output current IOUT2. The plurality of current sensors 2110_1, 2110_2, 2210_1, and 2210_2 may provide the first and second current information ID1 and ID2 to a voltage controller 2300 based on the sensed currents IIN1_INT, IOUT1_INT, IIN2, and IOUT2.

As in the description given with reference to FIGS. 1 and 2A, the voltage controller 2300 may generate the feedback signal FS based the first and second current information ID1 and ID2. According to an embodiment of the present disclosure, the voltage controller 2300 may monitor an increment or decrement of a level of the second output current IOUT2 from the second current information ID2, and may generate the feedback signal FS including information indicating whether to increase, decrease, or maintain a level of the first internal input voltage VIN1_INT for a next period. The power management integrated circuit 10 may adjust (e.g., increase, decrease, or maintain) the level of the first internal input voltage YIN1_INT for the next period based on a feedback signal FS. The first internal input voltage YIN1_INT thus adjusted may be provided to the first power module 2100.

As in the description given with reference to FIG. 3, an analog LDO regulator 2120 may generate the first internal output current IOUT1_INT. A digital LDO regulator 2220 may generate the comparison signal CS that is based on a result of comparing a level of a second reference voltage VREF2 and a level of the first internal input voltage YIN1_INT. As in the description given with reference to FIG. 4, the digital LDO regulator 2220 may generate the second output current IOUT2 through a shift register 2222 and a transistor array 2223. The first internal output current IOUT LINT and the second output current IOUT2 may form the output current IOUT at an output node NOUT. Accordingly, the power module 2000 may provide the output current IOUT. The output current IOUT may provide a load current IL that the system load 20 requires. A load capacitor having a load capacitance may be provided to maintain a level of the output voltage VOUT.

FIG. 6B illustrates an embodiment in which the shift register 2222 generates the second current information ID2. Referring to FIG. 6B, the first power module 2100 and the second power module 2200 may omit separate current sensors. For convenience, the description given with reference to FIG. 6A will be omitted to avoid redundancy. According to an embodiment of the present disclosure, the shift register 2222 may generate the second current information ID2 corresponding to the N-bit result code Q[N:1]. As in the description given with reference to FIGS. 1 and 2B, the voltage controller 2300 may generate the feedback signal FS based the second current information ID2.

A description will be given with reference to FIG. 6B together with the description given with reference to FIG. 5, under the assumption that the N-bit result code Q[N:1] is a 5-bit result code Q[5:1]. The voltage controller 2300 may periodically receive the second current information ID2 corresponding to the 5-bit result code Q[5:1]. When the 5-bit result code Q[5:1] is "11111" at period "t" and is "11110" at period "t+1", the voltage controller 2300 may sense that a level of a second current increases between the periods "t" and "t+1". Accordingly, when an increment of the level of the second current exceeds the first threshold value, the voltage controller 2300 may generate the feedback signal FS for increasing a level of the first input voltage VIN1 that the power management integrated circuit 10 will output. When the 5-bit result code Q[5:1] is "11100" at period "t" and is "11110" at period "t+1", the voltage controller 2300 may sense that a level of a second current decreases between the periods "t" and "t+1". Accordingly, when a decrement of the level of the second current exceeds the second threshold value, the voltage controller 2300 may generate the feedback signal FS for decreasing the level of the first input voltage VIN1 that the power management integrated circuit 10 will output.

Figure 7A:
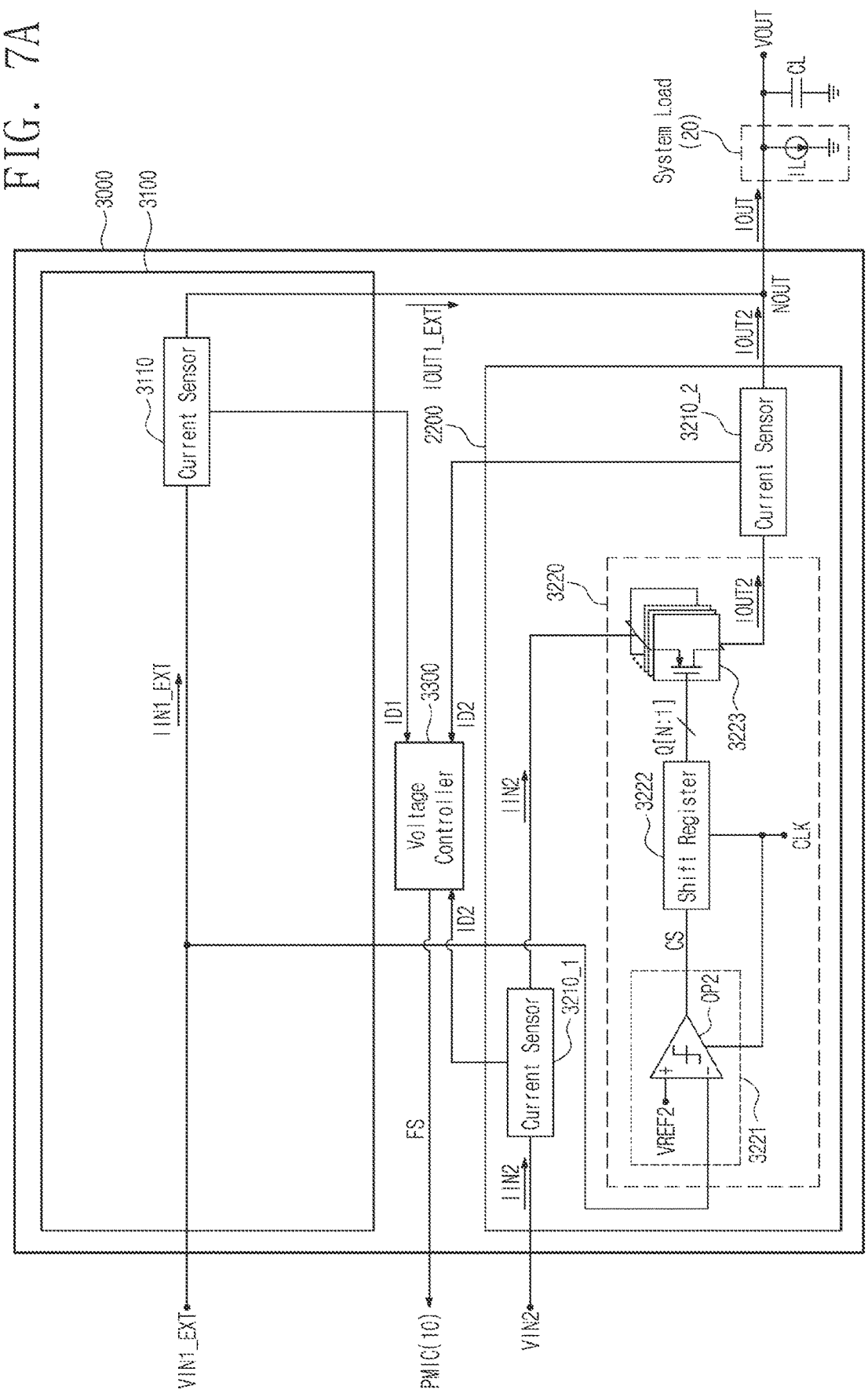
FIGS. 7A and 7B are configuration diagrams illustrating a power module operating in an external power supply manner, according to an embodiment of the present disclosure.
Figure 7B:
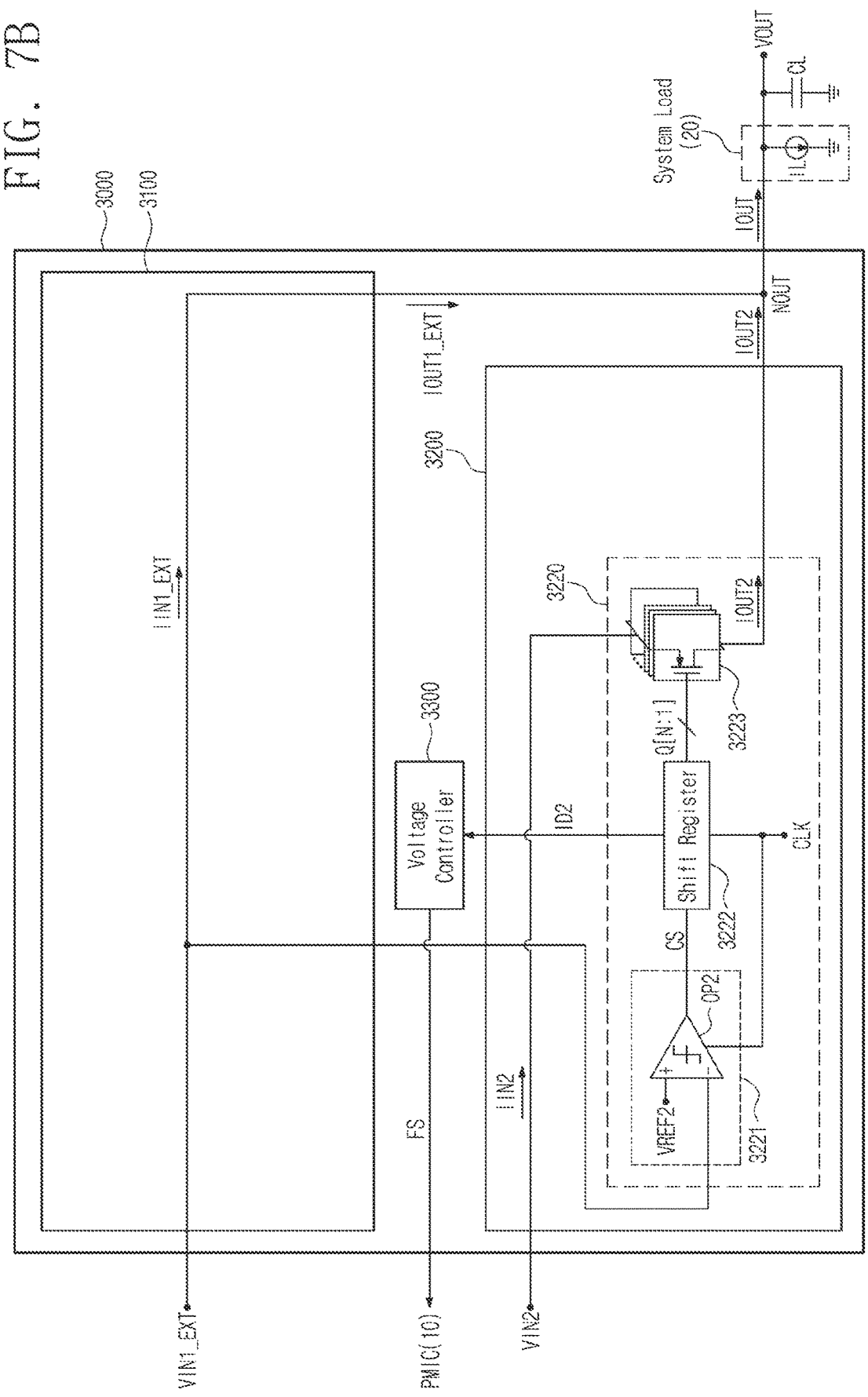

FIGS. 7A and 7B are configuration diagrams illustrating a power module operating in an external power supply mode, according to an embodiment of the present disclosure. Referring to FIGS. 7A and 7B, a power module 3000 may generate the output voltage VOUT in the external power supply mode. For convenience, the description given with reference to FIGS. 1 to 4 and 6A will be omitted to avoid redundancy.

FIG. 7A illustrates an embodiment in which the power module 3000 includes a separate current sensor in the external power supply mode. Referring to FIG. 7A, a first power module 3100 may include a current sensor 3110, and a second power module 3200 may include a plurality of current sensors 3210_1 and 3210_2. In addition to the plurality of current sensors 3110, 3210_1, and 3210_2, although not illustrated in FIG. 7A, a current sensor may be provided on an internal or external line of the power module 3000. Each of the plurality of current sensors 3110, 3210_1, and 3210_2 may sense a current flowing through a line. In detail the current sensor 3110 may sense a first external input current IIN1_EXT. The current sensor 3210_1 may sense the second input current IIN2. The current sensor 3210_2 may sense the second output current IOUT2. The plurality of current sensors 3110, 3210_1, and 3210_2 may provide the first and second current information ID1 and ID2 to a voltage controller 3300 based on the sensed currents IIN1_EXT, IIN2, and IOUT2.

In the case where the first power module 3100 operates in the external power supply mode, unlike the internal power supply mode, the first power module 3100 may not include a component such as an analog LDO regulator. That is, the first power module 3100 according to an embodiment of the present disclosure may include only a line through which a current flows. Accordingly, in FIG. 7A, the first external input current IIN1_EXT and a first external output current IOUT1_EXT are marked by different reference numerals for convenience of description, but reference the same current flowing through the same line.

A digital LDO regulator 3220 may generate the comparison signal CS that is based on a result of comparing a level of the second reference voltage VREF2 and a level of the first external input voltage VIN1_EXT. As in the description given with reference to FIG. 4, the digital LDO regulator 3220 may generate the second output current IOUT2 through a shift register 3222 and a transistor array 3223. The first internal output current IOUT1_INT and the second output current IOUT2 may form the output current IOUT at the output node NOUT.

FIG. 7B illustrates an embodiment in which the shift register 3222 generates the second current information ID2. Referring to FIG. 7B, the first power module 3100 and the second power module 3200 may omit separate current sensors. For convenience, the description given with reference to FIGS. 6A and 7A will be omitted to avoid redundancy.

Figure 8:
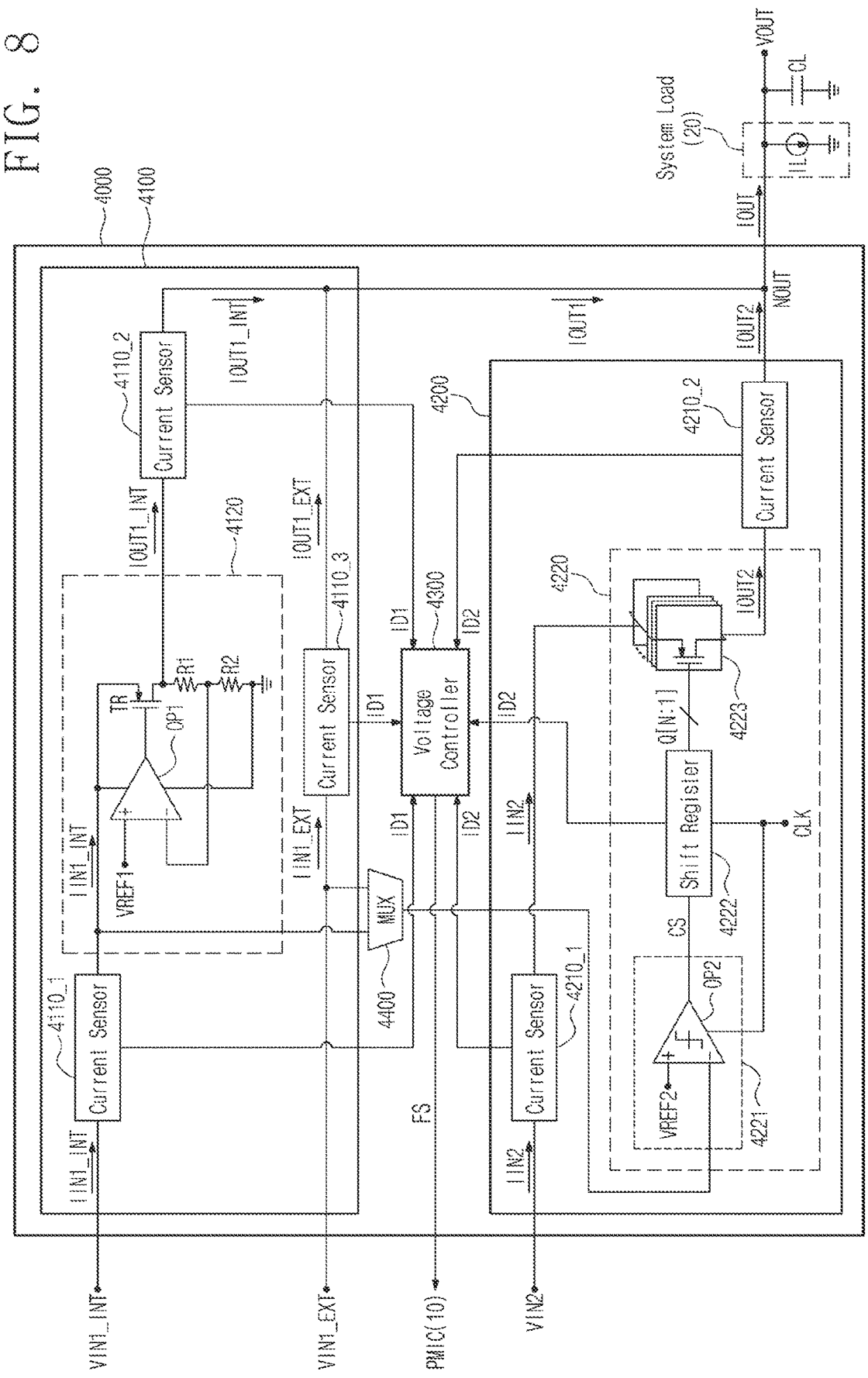
FIG. 8 is a configuration diagram illustrating a power module operating in an internal power supply manner and an external power supply manner, according to an embodiment of the present disclosure.

FIG. 8 is a configuration diagram illustrating a power module operating in an internal power supply mode and an external power supply mode, according to an embodiment of the present disclosure. According to an embodiment of the present disclosure, a power module 4000 may operate in the internal power supply mode and the external power supply mode. The description associated with the operation of the internal power supply mode or the external power supply mode described with reference to FIGS. 6A, 6B, 7A, and 7B will be omitted to avoid redundancy.

The power module 4000 may further include a multiplexer (MUX) 4400. The multiplexer 4400 may receive the first internal input voltage VIN1_INT and the first external input voltage VIN1_EXT. The multiplexer 4400 may select one of the first internal input voltage VIN1_INT and the first external input voltage VIN1_EXT based on a multiplexer control signal MCTR. Here, although the multiplexer control signal MCTR is not illustrated, the multiplexer control signal MCTR may be controlled (or generated) by a separate controller (not illustrated) located inside or outside the power module 4000. For example, the controller (not illustrated) may generate the multiplexer control signal MCTR for determining whether a first power module 4100 operates in the internal power supply mode or the external power supply mode, so as to coincide with a power level that the system load 20 requires. As a result, the multiplexer 4400 may output one selected from the first internal input voltage VIN1_INT and the first external input voltage VIN1_EXT.

The first power module 4100 may output the first output current IOUT1. Here, the first output current IOUT1 may correspond to one of the first internal output current IOUT1_INT or the first external output current IOUT1_EXT, depending on the selected power supply mode. A second power module 4200 may output the second output current IOUT2. Accordingly, the first output current IOUT1 and the second output current IOUT2 may form the output current IOUT at the output node NOUT. A voltage controller 4300 may generate the feedback signal FS based on at least one of a plurality of first current information ID1 and a plurality of second current information ID2.

Figure 9:
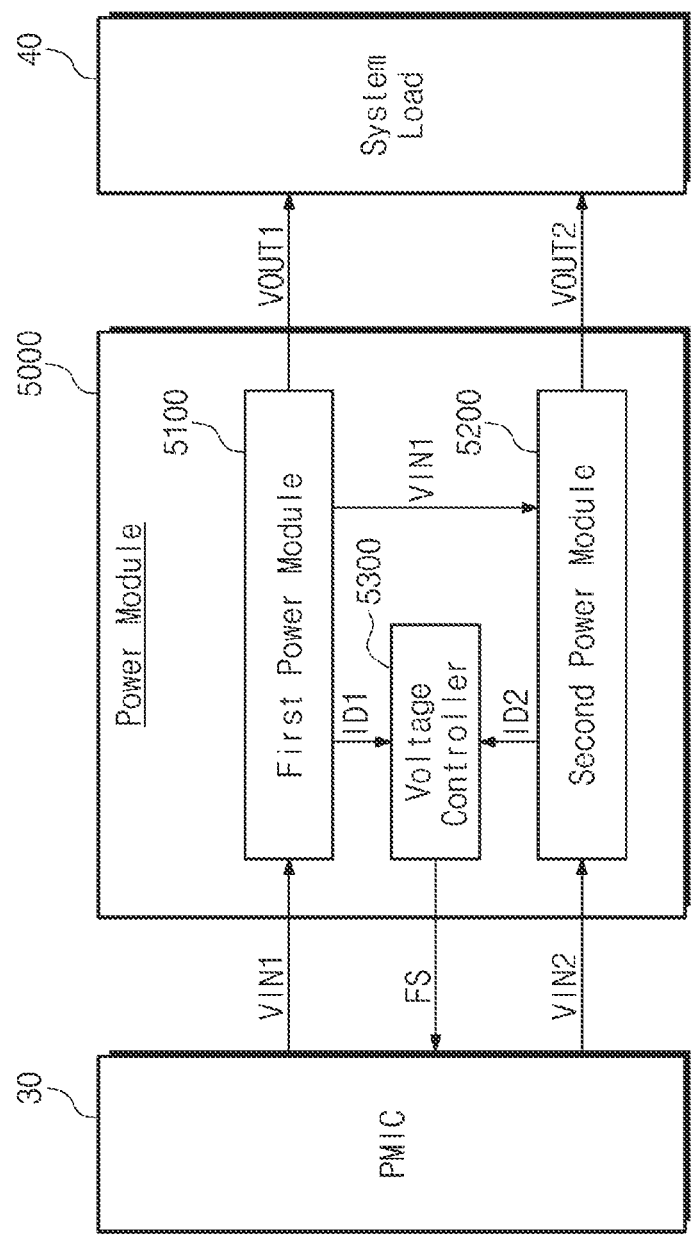
FIG. 9 is a configuration diagram illustrating an electronic device, according to another embodiment of the present disclosure.

FIG. 9 is a configuration diagram illustrating an electronic device, according to another embodiment of the present disclosure. For convenience, the description given with reference to FIG. 1 will be omitted to avoid redundancy.

The electronic device may include a power management integrated circuit 30, a power module 5000, and a system load 40. According to an embodiment of the present disclosure, the power module 5000 may output a first output voltage VOUT1 and a second output voltage VOUT2. The system load 40 may receive the first output voltage VOUT1 and the second output voltage VOUT2 and may internally utilize the received voltages VOUT1 and VOUT2. A level of the first output voltage VOUT1 may be regulated in real time by a voltage controller 5300. In the case where the system load 40 is capable of consuming power sufficiently efficiently by using the first output voltage VOUT1 only, the second output voltage VOUT2 may not be provided.

Figure 10:
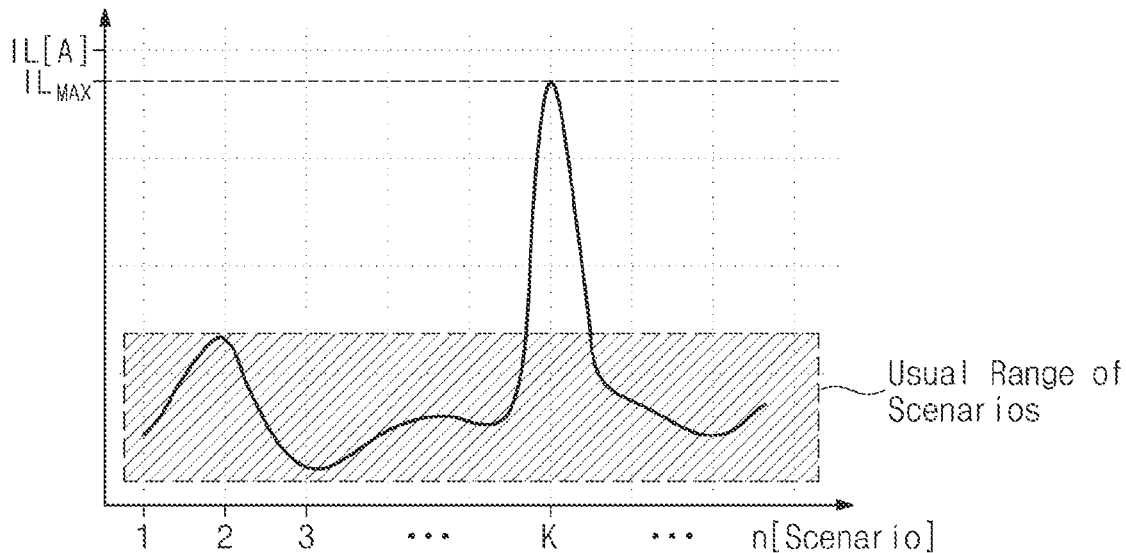
FIG. 10 is a graph illustrating a load current for each scenario, according to an embodiment of the present disclosure.

FIG. 10 is a graph illustrating a load current for each scenario, according to an embodiment of the present disclosure. In FIG. 10, an x-axis represents "n" scenarios over time, and a y-axis represents a level of the load current IL flowing to the system load 20 (refer to FIG. 1). In most scenarios, the load current may be specified within a usual range of scenarios. However, in the K-th scenario, a maximum load current $IL_{MAX}$ may flow to the system load 20. The maximum load current $IL_{MAX}$ may have a current that is significantly out of the usual range of scenarios. Accordingly, the power management integrated circuit 10 or the power module 1000 that provides a voltage to the system load 20 should provide a voltage of a level that is great enough for the system load 20 to operate normally.

However, to provide a voltage of a great level continuously to the system load 20 to cope with the maximum load current $IL_{MAX}$ being not usual may be inefficient in terms of power consumption. Referring to Equation 1 above, the load current IL may be determined by a sum of the first current I1 and the second current I2. Accordingly, the voltage controller 1300 may sense the variations in the load current IL by monitoring the first current I1 and the second current I2. For example, in a scenario (e.g., the (K−1)-th scenario) before the K-th scenario, the voltage controller 1300 may sense an increment of a level of the load current IL. When the increment of the level of the load current IL exceeds the first threshold value determined depending on a request of the user or settings of a manufacturer, the voltage controller 1300 may generate the feedback signal FS for increasing the level of the first input voltage VIN1 in a next period. In contrast, in a scenario (e.g., the (K+1)-th scenario) after the K-th scenario, the voltage controller 1300 may sense a decrement of the level of the load current IL. When the decrement of the level of the load current IL exceeds the second threshold value determined depending on a request of the user or settings of a manufacturer, the voltage controller 1300 may generate the feedback signal FS for decreasing the level of the first input voltage VIN1 in a next period. According to an embodiment of the present disclosure, as the level of the first input voltage VIN1 changes in real time, the system load 20 may consume power more efficiently. Power efficiency according to an embodiment of the present disclosure will be described in detail with reference to FIGS. 12A and 12B.

Figure 11:
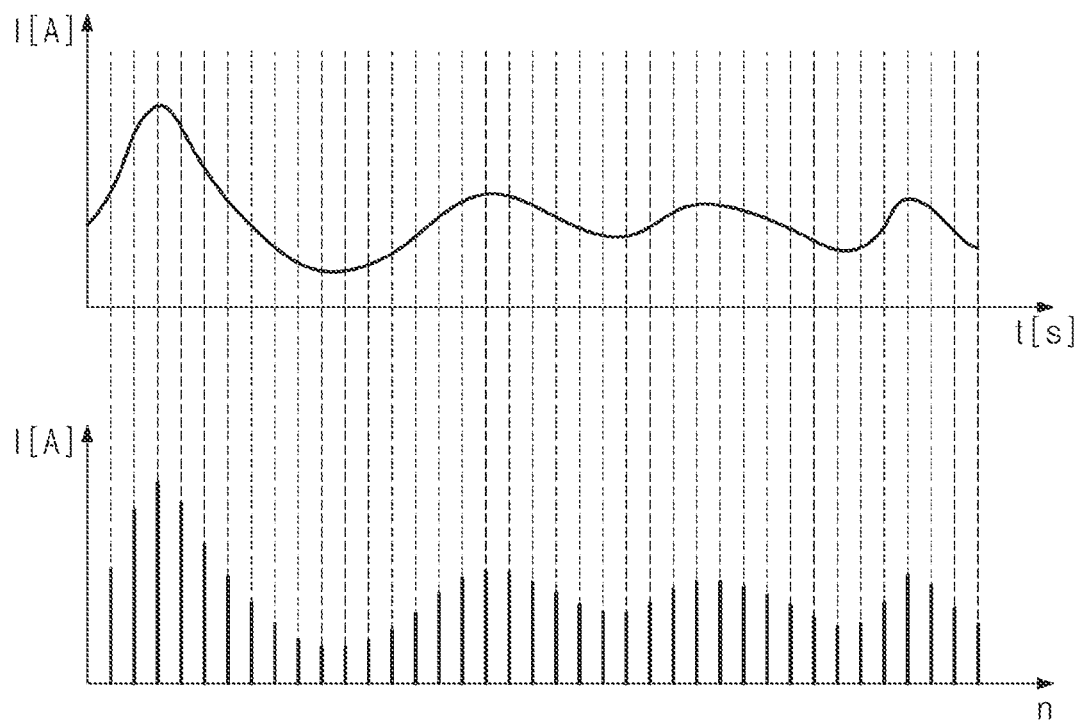
FIG. 11 is a graph illustrating a current sampling manner, according to an embodiment of the present disclosure.

FIG. 11 is a graph illustrating a current sampling mode, according to an embodiment of the present disclosure. Referring to FIG. 11, each of the current sensors 1110 and 1210 (refer to FIG. 1) may periodically sense a current flowing through a line. A current that each of the current sensors 1110 and 1210 senses may be periodically sampled by the current sensors 1110 and 1210 or the voltage controller 1300. A top graph of FIG. 11 shows a level of a current, which each of the current sensors 1110 and 1210 senses, in an analog form. A bottom graph of FIG. 11 shows values that are obtained by periodically sampling, by the current sensors 1110 and 1210 or the voltage controller 1300, a current level in an analog form. According to an embodiment of the present disclosure, a sensing period and/or a sampling period may change depending on a request of the user or settings of a manufacturer.

Figure 12A:
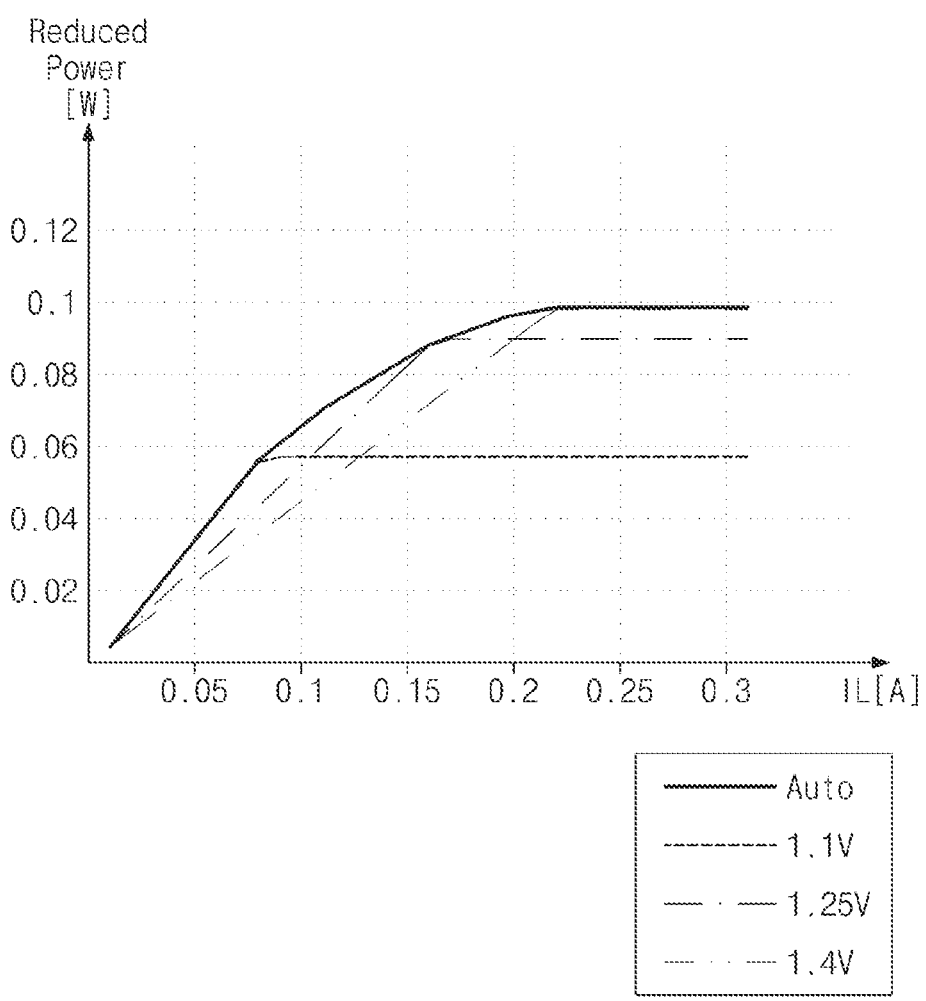
FIGS. 12A and 12B are graphs illustrating how much a power is reduced, according to an embodiment of the present disclosure.
Figure 12B:
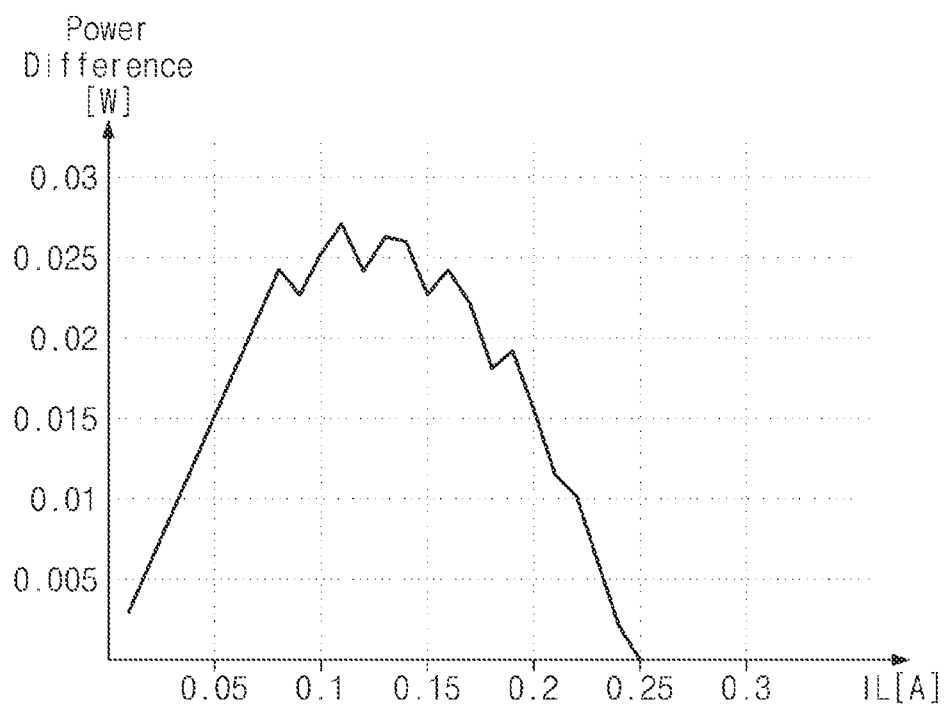

FIGS. 12A and 12B are graphs illustrating how much a power is reduced, according to an embodiment of the present disclosure. According to an embodiment of the present disclosure, FIG. 12A shows how much a power is reduced, in comparison to the case where a power is supplied to a system load by using one voltage source only. FIG. 12B shows power reduction in comparison to the case where a voltage controller of the present disclosure is not provided.

Referring to FIGS. 1 and 12A, according to an embodiment of the present disclosure, a power may be reduced in comparison to the case where a power is supplied to the system load by using one voltage source only (e.g., in comparison to the case where a second power module of the present disclosure is not provided). Meanwhile, an x-axis represents a level of the load current (IL), and a y-axis represents a reduced power. In FIG. 12A, an unbroken graph (Auto) shows the power reduction according to an embodiment of the present disclosure. The remaining graphs other than the unbroken graph (Auto) are measured under the assumption that the power module 1000 does not include the voltage controller 1300. A dashed graph (1.1V) shows the power reduction when a level of the first input voltage VIN1 input to a first power module is fixed to 1.1 V. A dash-dot dotted line graph (1.25V) shows the power reduction when the level of the first input voltage VIN1 input to the first power module is fixed to 1.25 V. A dash-double dot line graph (1.4V) shows the power reduction when the level of the first input voltage VIN1 input to the first power module is fixed to 1.4 V.

Referring to the trend of the remaining graphs other than the unbroken graph (Auto), when a level of the load current IL is low, a reduced power becomes greater as the level of the load current IL becomes lower. In contrast, when the level of the load current IL is high, the reduced power becomes greater as the level of the first input voltage VIN1 becomes higher. For example, when the level of the load current IL is less than 0.1 A, the reduced power is the greatest when the level of the first input voltage VIN1 is 1.1 V. When the level of the load current IL is greater than 0.1 A and less than 0.2 A, the reduced power is the greatest when the level of the first input voltage VIN1 is 1.25 V. When the level of the load current IL is greater than 0.2 A, the reduced power is the greatest when the level of the first input voltage VIN1 is 1.4 V. Accordingly, when the level of the first input voltage VIN1 is fixed, optimum power efficiency cannot be obtained in the situation where the level of the load current IL fluctuates greatly.

Referring to FIG. 12A, the trend of the unbroken graph (Auto), regardless of the load current IL, the reduced power is always equal to or greater than that when the first input voltage VIN1 is fixed. Accordingly, optimum power efficiency may always be obtained even in the situation where the fluctuations of the load current IL are great.

FIG. 12B shows a power difference of the present disclosure in comparison to the case where the level of the first input voltage VIN1 (refer to FIG. 1) is fixed to 1.4 V (corresponding to the dash-double dot line graph in FIG. 12A). Meanwhile, the x-axis represents the level of the load current IL, and the y-axis represents the power difference. According to an embodiment of the present disclosure, the level of the first input voltage VIN1 may be regulated in real time every given period based on the variations in the level of the load current IL. For example, when the level of the load current IL is low (e.g., 0.1 A), the level of the first input voltage VIN1 may be lower than 1.4 V. Accordingly, the present disclosure may always obtain optimum power efficiency, in comparison to the case where the level of the first input voltage VIN1 is fixed to 1.4 V.

Figure 13:
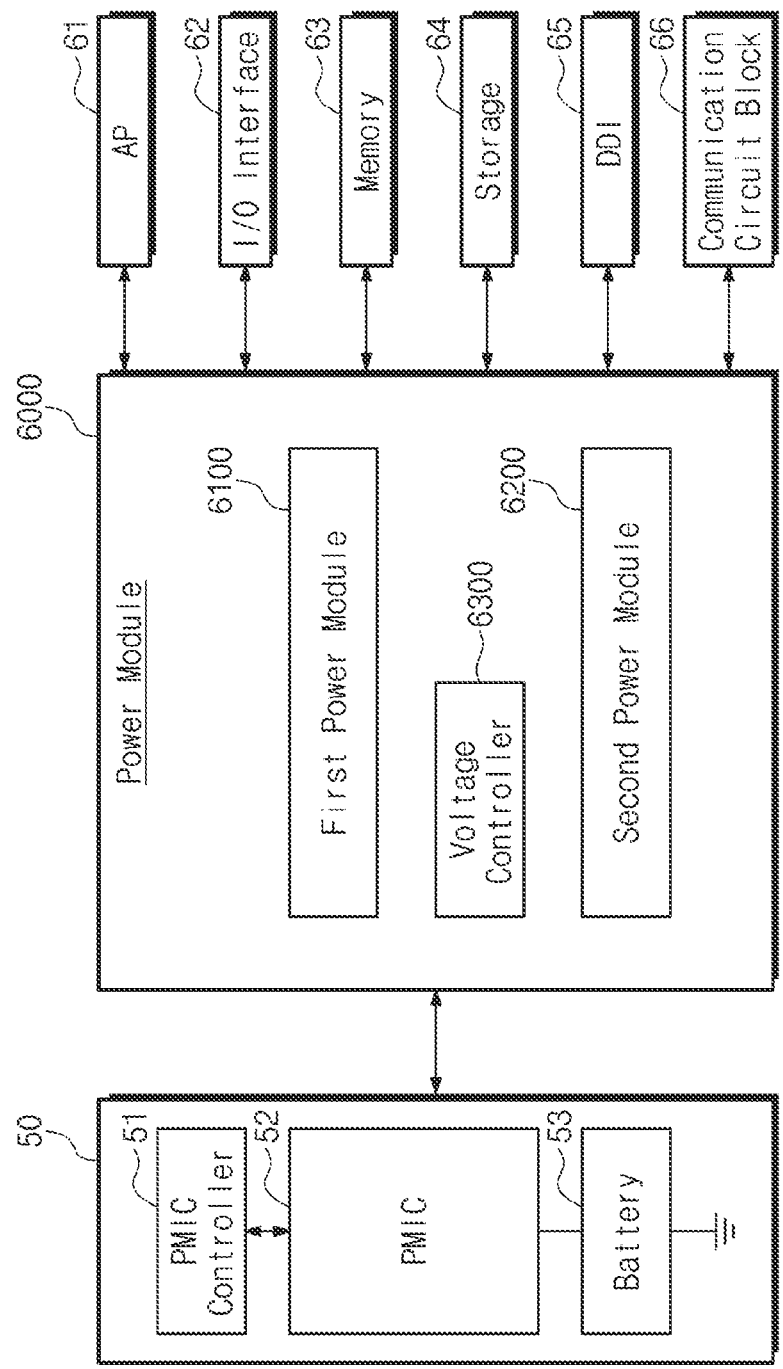
FIG. 13 is a configuration diagram illustrating a communication structure of an electronic device, according to an embodiment of the present disclosure.

FIG. 13 is a configuration diagram illustrating a communication structure of an electronic device, according to an embodiment of the present disclosure. The electronic device may include a power supply device 50, a power module 6000, an application processor (AP) 16, an input/output interface 62, a memory 63, storage 64, a display driver integrated circuit (DDI) 65, and a communication circuit block 66. In addition, the electronic device may further include any other circuit, module, or block that requires power.

The power supply device 50 may include a PMIC controller 51, a power management integrated circuit 52, and a battery 53. For example, the power supply device 50 may be a separate device. The PMIC controller 51 may regulate a level of a voltage that the power management integrated circuit 52 provides, based on a feedback signal that a voltage controller 6300 provides. The PMIC controller 51 may be located outside the power management integrated circuit 52; however, unlike the example of FIG. 13, the PMIC controller 51 may be integrated in the power management integrated circuit 52. The battery 53 may provide power such that the power management integrated circuit 52 is capable of generating a voltage.

The power module 6000 may include a first power module 6100, a second power module 6200, and the voltage controller 6300. The voltage controller 6300 may communicate with the PMIC controller 51 and/or the power management integrated circuit 52. The voltage controller 6300 may request the PMIC controller 51 and/or the power management integrated circuit 52 for a voltage that the power module 6000 requires. According to an embodiment of the present disclosure, the voltage controller 6300 may be located in the power module 6000, but the present disclosure is not limited thereto. For example, unlike the example of FIG. 13, the voltage controller 6300 may be located in any of the application processor 61, the input/output interface 62, the memory 63, the storage 64, the display driver integrated circuit 65, and the communication circuit block 66.

Figure 14:
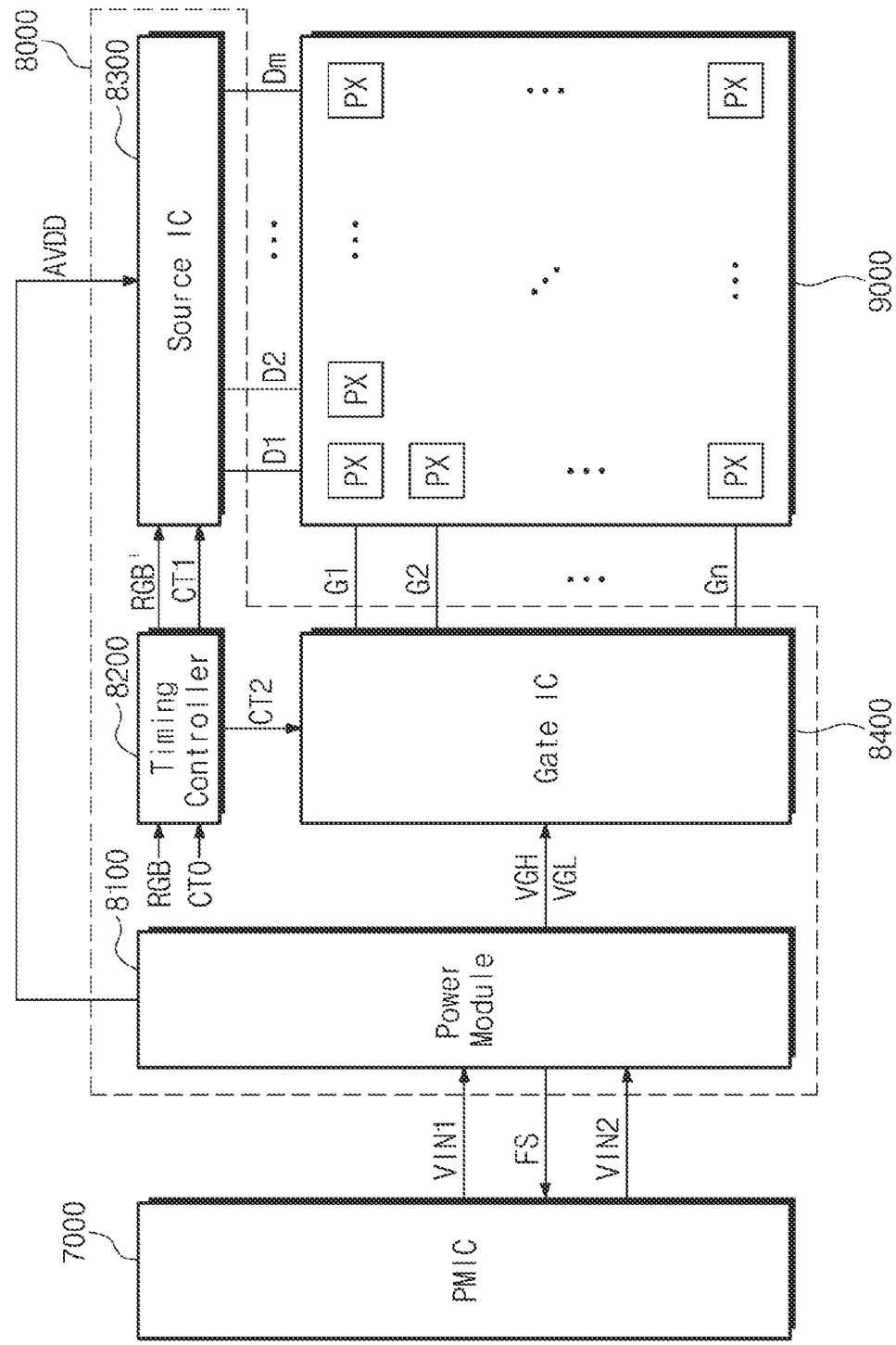
FIG. 14 is a configuration diagram illustrating a display device, according to an embodiment of the present disclosure.

FIG. 14 is a configuration diagram illustrating a display device, according to an embodiment of the present disclosure. A display device may include a power management integrated circuit 7000, a display driving circuit 8000, and a display panel 9000. The power management integrated circuit 7000 may generate the first input voltage VIN1 and the second input voltage VIN2.

The display driving circuit 800 may include a power module 8100, a timing controller 8200, a source driver integrated circuit (IC) 8300, and a gate driver integrated circuit (IC) 8400. The display driving circuit 8000 may provide a power necessary for the display panel 9000 based on at least one of the first input voltage VIN1 and the second input voltage VIN2. The power module 8100 may generate a voltage so as to have optimum power efficiency. For example, the power module 8100 may generate an analog power supply voltage AVDD and gate driving voltages VGH and VGL. The power module 8100 may generate the output voltage VOUT (refer to FIG. 1) (e.g., the analog power supply voltage AVDD and the gate driving voltages VGH and VGL) based on the first input voltage VIN1 and the second input voltage VIN2 different from each other.

The power module 8100 may generate the first current I1 (refer to Equation 1) based on the first input voltage VIN1. When the first input voltage VIN1 is dropped due to increased power consumption of the display panel 9000, the power module 8100 may output the second current I2 (refer to Equation 1) based on the first input voltage VIN1 and the second input voltage VIN2. According to an embodiment of the present disclosure, to regulate the level of the first input voltage VIN1, the power module 8100 may monitor the first current I1 and/or the second current I2. According to an embodiment of the present disclosure, a period at which the power module 8100 monitors and/or samples the first current I1 and/or the second current I2 may correspond to a frame unit by which the display panel 9000 displays an image. However, the present disclosure is not limited thereto. For example, the period may be determined regardless of a frame. Also, according to an embodiment of the present disclosure, a period at which the power module 8100 regulates the level of the first input voltage VIN1 may correspond to a frame unit by which the display panel 9000 displays an image. However, the present disclosure is not limited thereto. For example, the period may be determined regardless of a frame.

The timing controller 8200 may control overall operations of the display driving circuit 800. The timing controller 8200 receives image data RGB and a control signal CT0 from the outside. The control signal CT0 may include a vertical synchronization signal as a signal for distinguishing frames, a horizontal synchronization signal as a signal for distinguishing rows, and a data enable signal that has a high level while data are output and indicates a zone in which data are received. The timing controller 8200 outputs a first control signal CT1, a second control signal CT2, and modulated image data RGB'. The timing controller 8200 generates the modulated image data RGB' by converting a data format of the image data RGB to be suitable for an interface specification of the source driver IC 8300 and provides the modulated image data RGB' to the source driver IC 8300. The first control signal CT1 refers to a signal for controlling an operation of the source driver IC 8300. The first control signal CT1 may include a horizontal start signal indicating an initiation of an operation of the source driver IC 8300 and an output indication signal for determining a timing when a data voltage is output from the source driver IC 8300. The second control signal CT2 refers to a signal for controlling an operation of the gate driver IC 8400. The second control signal CT2 may include a gate clock and a vertical start signal.

The source driver IC 8300 outputs data voltages to data lines D1 to Dm based on the first control signal CT1 and the modulated image data RGB'. The source driver IC 8300 may perform a digital-to-analog conversion operation on the modulated image data RGB' so as to be converted into data voltages.

The gate driver IC 8400 provides gate signals to gate lines G1 to Gn based on the second control signal CT2. The gate driver IC 8400 generates the gate signals for driving the gate lines G1 to Gn based on the second control signal CT2 and sequentially output the gate signals to the gate lines G1 to Gn.

The display panel 9000 may display an image. For example, the display panel 9000 may be implemented in various panels such as an organic light-emitting diode (OLED) panel, an active matrix organic light-emitting diode (AMOLED) panel, a liquid crystal display (LCD) panel, an electrophoretic display panel, an electrowetting display panel, and a plasma display panel (PDP). The display panel 9000 includes the gate lines G1 to Gn, the data lines D1 to Dm, and pixels PX. Each of the gate lines G1 to Gn receives a gate voltage from the display driving circuit 8000. Each of the data lines D1 to Dm receives a data voltage from the display driving circuit 8000. The gate lines G1 to Gn and the data lines D1 to Dm are electrically isolated and cross each other. Each of the pixels PX may be connected with one of the gate lines G1 to Gn and one of the data lines D1 to Dm.

Figure 15:
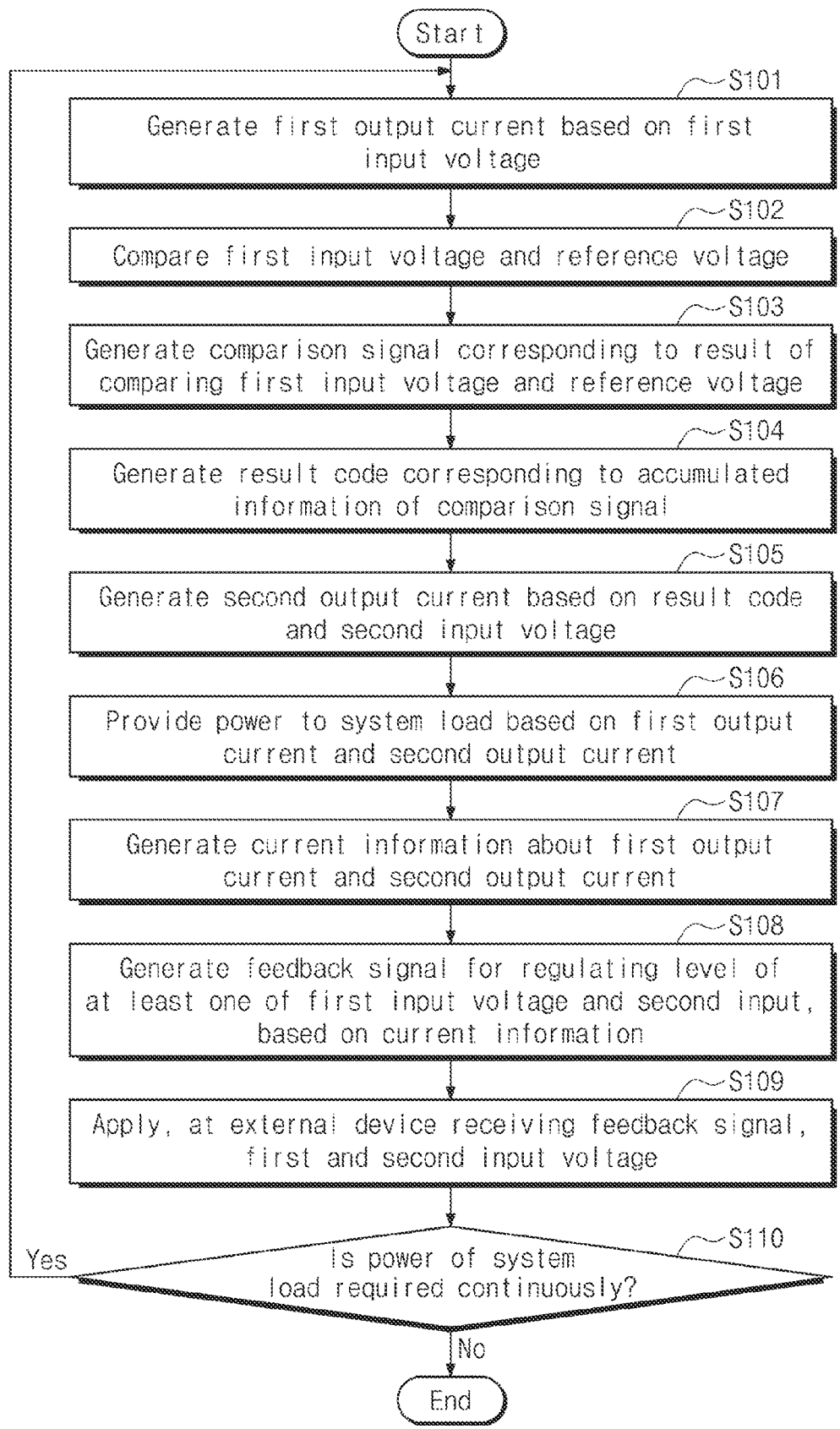
FIG. 15 is a flowchart illustrating an operating method of an electronic device, according to an embodiment of the present disclosure.

FIG. 15 is a flowchart illustrating an operating method of an electronic device, according to an embodiment of the present disclosure. For convenience of description, FIG. 15 will be described with reference to reference marks/numerals of FIG. 8.

In operation S101, the first power module 4100 may generate the first output current IOUT1 based on the first input voltage VIN1 received from the outside. According to an embodiment of the present disclosure, the power module 4000 may select one of the internal power supply mode and the external power supply mode depending on the load current IL of the system load 20. Accordingly, the first input voltage VIN1 may be the first internal input voltage VIN1_INT or the first external input voltage VIN1_EXT depending on the power supply mode. For example, in the internal power supply mode, the first power module 4100 may generate the first internal output current IOUT1_INT through an analog LDO regulator based on the first internal input voltage VIN1_INT. Meanwhile, in the external power supply mode, the power module 4100 may generate the first external output current IOUT1_EXT based on the first external input voltage VIN1_EXT.

In operation S102, the second power module 4200 may compare a level of the first input voltage VIN1 and a level of the second reference voltage VREF2.

In operation S103, the comparator 4221 may generate the comparison signal CS based on a result of comparing the level of the first input voltage VIN1 and the level of the second reference voltage VREF2. For example, when the level of the second reference voltage VREF2 is higher than the level of the first input voltage VIN1, the comparator 4221 may generate the comparison signal CS of a value (e.g., "1") indicating logic high. In contrast, when the level of the second reference voltage VREF2 is lower than the level of the first input voltage VIN1, the comparator 4221 may generate the comparison signal CS of a value (e.g., "0") indicating logic low.

In operation S104, the shift register 4222 may generate the result code "Q" corresponding to accumulated information of the comparison signal CS based on the comparison signal CS.

In operation S105, the transistor array 4223 may generate the second output current IOUT2 based on the result code "Q" and the second input voltage VIN2.

In operation S106, the power module 4000 may provide a power to the system load 20 by generating the output current IOUT based on the first output current IOUT1 and the second output current IOUT2.

In operation S107, the current sensors 4110_1, 4110_2, 4110_3, 4210_1, and 4210_2 may generate the first and second current information ID1 and ID2 by sensing currents flowing in the first power module 4100 and the second power module 4200. According to an embodiment of the present disclosure, the shift register 4222 may generate the second current information ID2 corresponding to the result code "Q".

In operation S108, the voltage controller 4300 may generate the feedback signal FS including information indicating whether to increase, decrease, or maintain a level of the first input voltage VIN1 and/or the second input voltage VIN2 for a next period, based on the first and second current information ID1 and ID2.

In operation S109, the voltage controller 4300 may send the feedback signal FS to the outside. An external device that receives the feedback signal FS may apply, to the power module 4000, the first input voltage VIN1 and/or the second input voltage VIN2 having a regulated level (e.g., an increased, decreased, or maintained level).

In operation S110, whether the system load 20 continuously requires power is determined. When it is determined that the system load 20 continuously requires a power (Yes), the procedure proceeds to operation S101. When it is determined that the system load 20 does not require power (No), the procedure ends.

According to the present disclosure, even though a level of a current flowing to a system load changes, an electronic device may consume power always with optimum efficiency by regulating a level of an input voltage in real time.

While the present disclosure has been described with reference to embodiments thereof, it will be apparent to those of skill in the art that various changes and modifications may be made thereto without departing from the spirit and scope of the present disclosure as set forth in the following claims.

What is claimed is:

1. A power module comprising:
   a first power module configured to generate a first output current based on a first input voltage;
   a second power module configured to generate a second output voltage based on a second input voltage, to generate a second output current based on the second output voltage, and to generate the second output current when a level of the first input voltage is smaller than a level of a reference voltage; and
   a voltage controller configured to generate a feedback signal for regulating at least one of the level of the first input voltage and a level of the second input voltage based on current information about a current flowing in the power module.

2. The power module of claim 1, wherein the second power module includes:

a current sensor configured to sense a current flowing in
the second power module and to generate information
about the current flowing in the second power module,
and wherein the current information includes information
about the current flowing in the second power module.

3. The power module of claim 2, wherein the current information includes a set of values obtained by sampling a level of the current flowing in the second power module.

4. The power module of claim 3, wherein the voltage controller is configured to:
calculate an increment or a decrement of the level of the current flowing in the second power module by comparing the level of the current in a current period with a level of the current in a next period based on the current information;
when the increment exceeds a first threshold value, generate a feedback signal for increasing the level of the first input voltage; and
when the decrement exceeds a second threshold value, generate a feedback signal for decreasing the level of the first input voltage.

5. The power module of claim 4, wherein the voltage controller is configured to determine at least one of a period at which sampling is performed, a period at which the feedback signal is generated, a period at which the level of the first input voltage increases or decreases, and a period at which the current information is received.

6. The power module of claim 1, wherein the first power module includes a first current sensor configured to sense a first current flowing in the first power module and to generate information about the first current,
wherein the second power module includes a second current sensor configured to sense a second current flowing in the second power module and to generate information about the second current, and
wherein the current information includes information about the first current and the information about the second current.

7. The power module of claim 1, wherein the second power module includes:
a comparator configured to generate a comparison signal based on a comparison result of comparing the first input voltage and the reference voltage;
a shift register configured to generate a result code based on the comparison signal; and
a transistor array configured to generate the second output current based on the result code and the second input voltage.

8. The power module of claim 7, wherein the result code includes a plurality of bits and corresponds to a level of the second output current.

9. The power module of claim 8, wherein the comparator generates the comparison signal having a first bit value when the first input voltage is greater than the reference voltage and having a second bit value when the first input voltage is smaller than the reference voltage, and
wherein the shift register shifts the result code in a first direction when the comparison signal has the first bit value and shifts the result code in a second direction when the comparison signal has the second bit value.

10. The power module of claim 9, wherein the transistor array includes a plurality of transistors respectively corresponding to the plurality of bits, and
wherein each of the plurality of bits has a value corresponding to a turn-on or turn-off of the corresponding one of the plurality of transistors.

11. The power module of claim 10, wherein the level of the second output current increases as the number of transistors turned on from among the plurality of transistors increases and decreases as the number of transistors turned on from among the plurality of transistors decreases.

12. The power module of claim 11, wherein the shift register generates the current information and provides the current information to the voltage controller, and
wherein the current information corresponds to the result code.

13. The power module of claim 12, wherein the voltage controller is configured to:
calculate an increment or a decrement of a level of the second output current by comparing the level of the second output current in a current period and the level of the second output current in a next period based on the current information corresponding to the result code;
when the increment exceeds a first threshold value, generate the feedback signal for increasing the level of the first input voltage; and
when the decrement exceeds a second threshold value, generate the feedback signal for decreasing the level of the first input voltage.

14. A method of supplying power, the method comprising:
generating a first output current based on a first input voltage;
comparing a level of the first input voltage and a level of a reference voltage;
generating a comparison signal based on a comparison result of comparing the level of the first input voltage and the level of the reference voltage;
generating a result code corresponding to accumulated information of the comparison signal;
generating a second output current based on the result code and a second input voltage;
providing power to an external device based on the first output current and the second output current;
sensing at least one of the first output current and the second output current to generate current information;
generating a feedback signal for regulating a level of at least one of the first input voltage and the second input voltage based on the current information; and
regulating and outputting the level of the at least one of the first input voltage and the second input voltage based on the feedback signal.

15. The method of claim 14, wherein the current information includes information about the second output current.

16. The method of claim 15, wherein the generating of the feedback signal for regulating the level of the at least one of the first input voltage and the second input voltage based on the current information includes:
when an increment of the second output current exceeds a first threshold value, generating the feedback signal for increasing the level of the first input voltage; and
when a decrement of the second output current exceeds a second threshold value, generating the feedback signal for decreasing the level of the first input voltage.

17. A display device comprising:
a display panel configured to display an image;
a power management integrated circuit configured to generate a first input voltage and a second input voltage; and
a display driving circuit configured to generate gate signals on a plurality of gate lines and to generate data voltages on a plurality of data lines, wherein the display driving circuit includes:
a power module configured to provide a power necessary for the display panel based on at least one of the first input voltage and the second input voltage,
wherein the power module is configured to:
generate a first current based on the first input voltage;
when a drop of the first input voltage occurs, generate a second current based on the first input voltage and a second input voltage; and
monitor the first current and the second current to generate a feedback signal for regulating a level of at least one of the first input voltage and the second input voltage based on at least one of the first current and the second current.

18. The display device of claim 17, wherein a period at which the power module monitors the first current and the second current corresponds to a frame period by which the display panel displays the image.

19. The display device of claim 17, wherein the power module generates a set of values obtained by sampling a level of the first current and a level of the second current, and
wherein a period for sampling corresponds to a frame unit by which the display panel displays the image.

20. The display device of claim 17, wherein the power management integrated circuit regulates the level of the at least one of the first input voltage and the second input voltage to generate the first input voltage and the second input voltage, and
wherein a period at which the level is regulated corresponds to a frame period by which the display panel displays the image.

* * * * *